United States Patent [19]

On et al.

[11] Patent Number: 4,998,257

[45] Date of Patent: Mar. 5, 1991

[54] SEMICONDUCTOR LASER DRIVING APPARATUS

[75] Inventors: Bill On, Houston, Tex.; Shinsuke Funaki, Tokyo, Japan

[73] Assignee: Konica Corporation, Tokyo, Japan

[21] Appl. No.: 490,057

[22] Filed: Mar. 7, 1990

[30] Foreign Application Priority Data

Mar. 9, 1989 [JP] Japan ................. 64-55145

[51] Int. Cl.[5] ............................................. H01S 3/00
[52] U.S. Cl. ........................................ 372/38; 372/29
[58] Field of Search .................................... 372/38, 29

[56] References Cited

U.S. PATENT DOCUMENTS

| | | | |
|---|---|---|---|
| 4,831,626 | 5/1989 | Watanabe et al. | 372/38 |
| 4,835,780 | 5/1989 | Sugimura et al. | 372/38 |
| 4,890,288 | 12/1989 | Inuyama et al. | 372/38 |
| 4,899,344 | 2/1990 | Shibata et al. | 372/38 |
| 4,912,717 | 3/1990 | Takeuchi | 372/38 |
| 4,928,248 | 5/1990 | Takahashi et al. | 372/38 |
| 4,945,541 | 7/1990 | Nakazama | 372/38 |

Primary Examiner—Léon Scott, Jr.

Attorney, Agent, or Firm—Finnegan, Henderson, Farabow, Garrett, and Dunner

[57] ABSTRACT

A semiconductor laser driving apparatus wherein an irradiating energy of a semiconductor laser is adjusetd multi-stepwise by varying the irradiating time within the maximum irradiating time while maintaining at a constant value the optical output when the irradiating energy is lower than a predetermined value, whereas the irradiating energy is adjusted multi-stepwise by increasing the optical output more than the constant value while fixing the irradiating time to the maximum irradiating time when the irradiating energy is higher than the predetermined value. A semiconductor laser driving apparatus having a plurality of current generation devices whose current generation is controlled in accordance with input pulse signals, a semiconductor laser connected in series with parallel connection terminals of these current generation devices, and current control device for adjusting a supply current to the semiconductor laser by controlling the pulse widths of the input pulse signals to the plurality of current generation devices, respectively.

13 Claims, 33 Drawing Sheets

F I G. 3
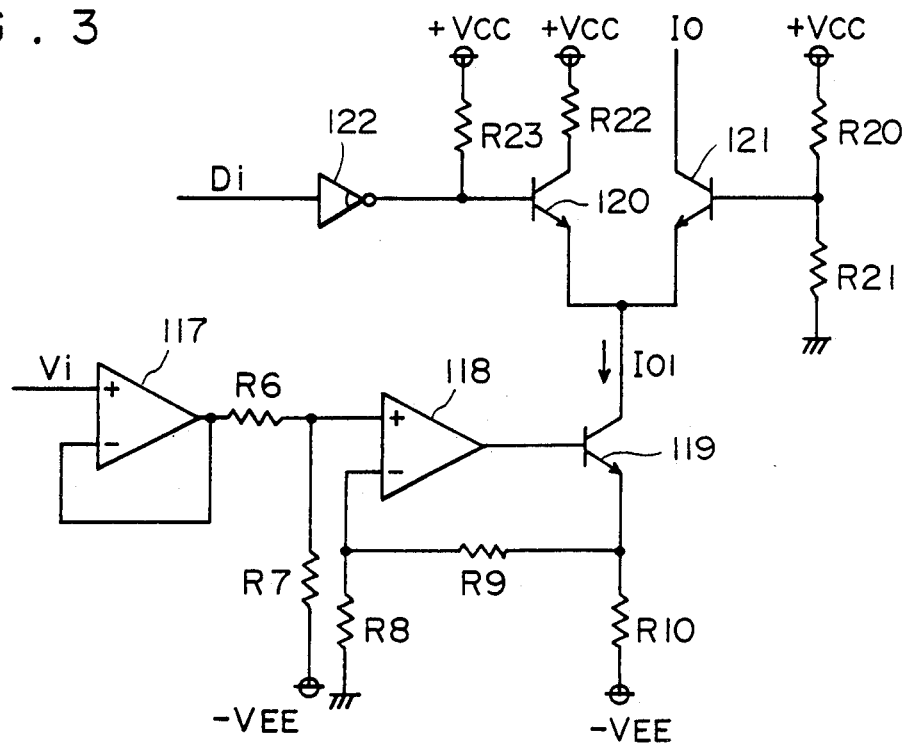
F I G. 45
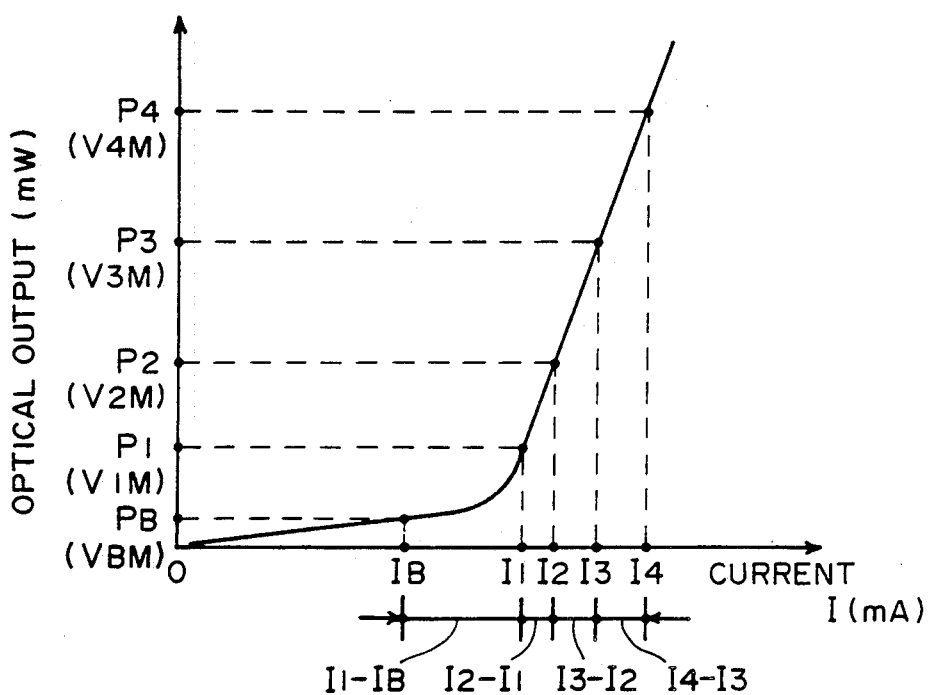

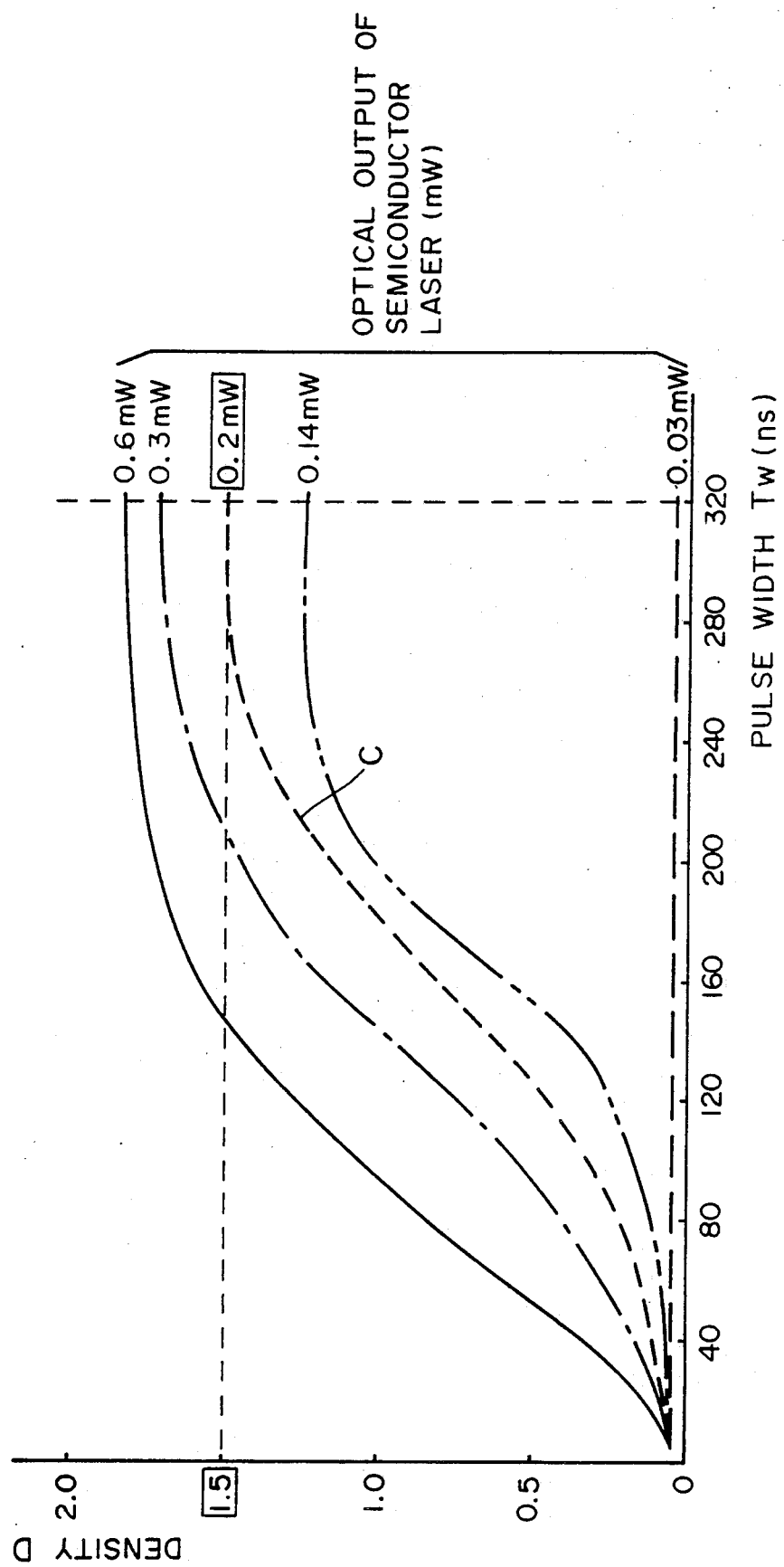

F I G . 14

| D7 | D6 | D5 | D4 | outpls |
|---|---|---|---|---|
| 0 | 0 | 0 | 0 | 1/16 CLK (1/16) |
| 0 | 0 | 0 | 1 | 1/8 CLK (2/16) |
| 0 | 0 | 1 | 0 | 3/16 CLK (3/16) |
| 0 | 0 | 1 | 1 | 1/4 CLK (4/16) |
| 0 | 1 | 0 | 0 | 5/16 CLK (5/16) |
| 0 | 1 | 0 | 1 | 3/8 CLK (6/16) |
| 0 | 1 | 1 | 0 | 7/16 CLK (7/16) |
| 0 | 1 | 1 | 1 | 1/2 CLK (8/16) |
| 1 | 0 | 0 | 0 | 9/16 CLK (9/16) |
| 1 | 0 | 0 | 1 | 5/8 CLK (10/16) |
| 1 | 0 | 1 | 0 | 11/16 CLK (11/16) |
| 1 | 0 | 1 | 1 | 3/4 CLK (12/16) |
| 1 | 1 | 0 | 0 | 13/16 CLK (13/16) |
| 1 | 1 | 0 | 1 | 7/8 CLK (14/16) |
| 1 | 1 | 1 | 0 | 15/16 CLK (15/16) |
| 1 | 1 | 1 | 1 | 1 CLK (16/16) |

F I G . 16
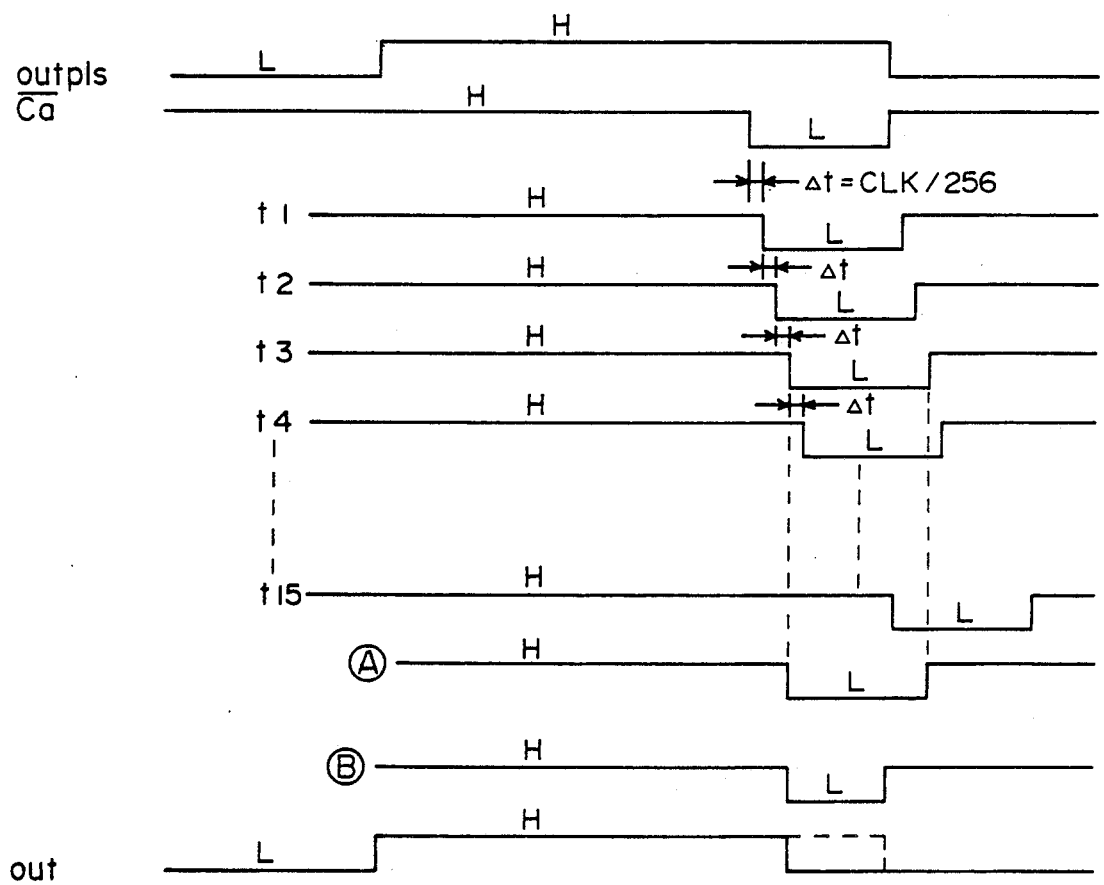
F I G . 18
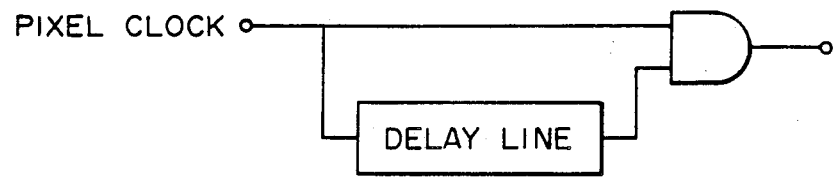
F I G . 19
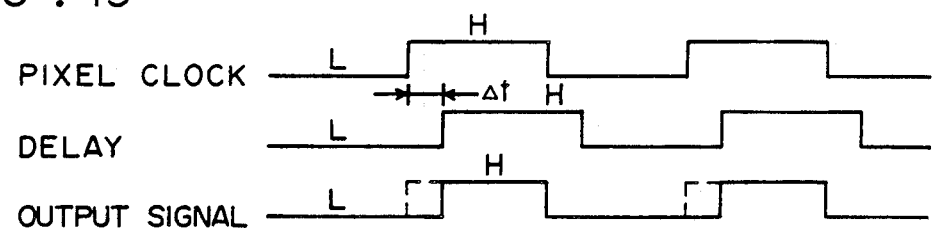

FIG. 17

| D3 D2 D1 D0 | Ⓐ | out | FUNCTION |
|---|---|---|---|
| 0 0 0 0 | t1 | ($\overline{Ca}$ + t1) & out pls | 15/16 X 1/16 CLK CANCEL |
| 0 0 0 1 | t2 | ($\overline{Ca}$ + t2) & out pls | 7/8 X 1/16 CLK CANCEL |
| 0 0 1 0 | t3 | ($\overline{Ca}$ + t3) & out pls | 13/16 X 1/16 CLK CANCEL |
| 0 0 1 1 | t4 | ($\overline{Ca}$ + t4) & out pls | 3/4 X 1/16 CLK CANCEL |
| 0 1 0 0 | t5 | ($\overline{Ca}$ + t5) & out pls | 11/16 X 1/16 CLK CANCEL |
| 0 1 0 1 | t6 | ($\overline{Ca}$ + t6) & out pls | 5/8 X 1/16 CLK CANCEL |
| 0 1 1 0 | t7 | ($\overline{Ca}$ + t7) & out pls | 9/16 X 1/16 CLK CANCEL |
| 0 1 1 1 | t8 | ($\overline{Ca}$ + t8) & out pls | 1/2 X 1/16 CLK CANCEL |
| 1 0 0 0 | t9 | ($\overline{Ca}$ + t9) & out pls | 7/16 X 1/16 CLK CANCEL |
| 1 0 0 1 | t10 | ($\overline{Ca}$ + t10) & out pls | 3/8 X 1/16 CLK CANCEL |
| 1 0 1 0 | t11 | ($\overline{Ca}$ + t11) & out pls | 5/16 X 1/16 CLK CANCEL |
| 1 0 1 1 | t12 | ($\overline{Ca}$ + t12) & out pls | 1/4 X 1/16 CLK CANCEL |
| 1 1 0 0 | t13 | ($\overline{Ca}$ + t13) & out pls | 3/16 X 1/16 CLK CANCEL |
| 1 1 0 1 | t14 | ($\overline{Ca}$ + t14) & out pls | 1/8 X 1/16 CLK CANCEL |
| 1 1 1 0 | t15 | ($\overline{Ca}$ + t15) & out pls | 1/16 X 1/16 CLK CANCEL |
| 1 1 1 1 | 1 | out pls | WITHOUT CANCEL |

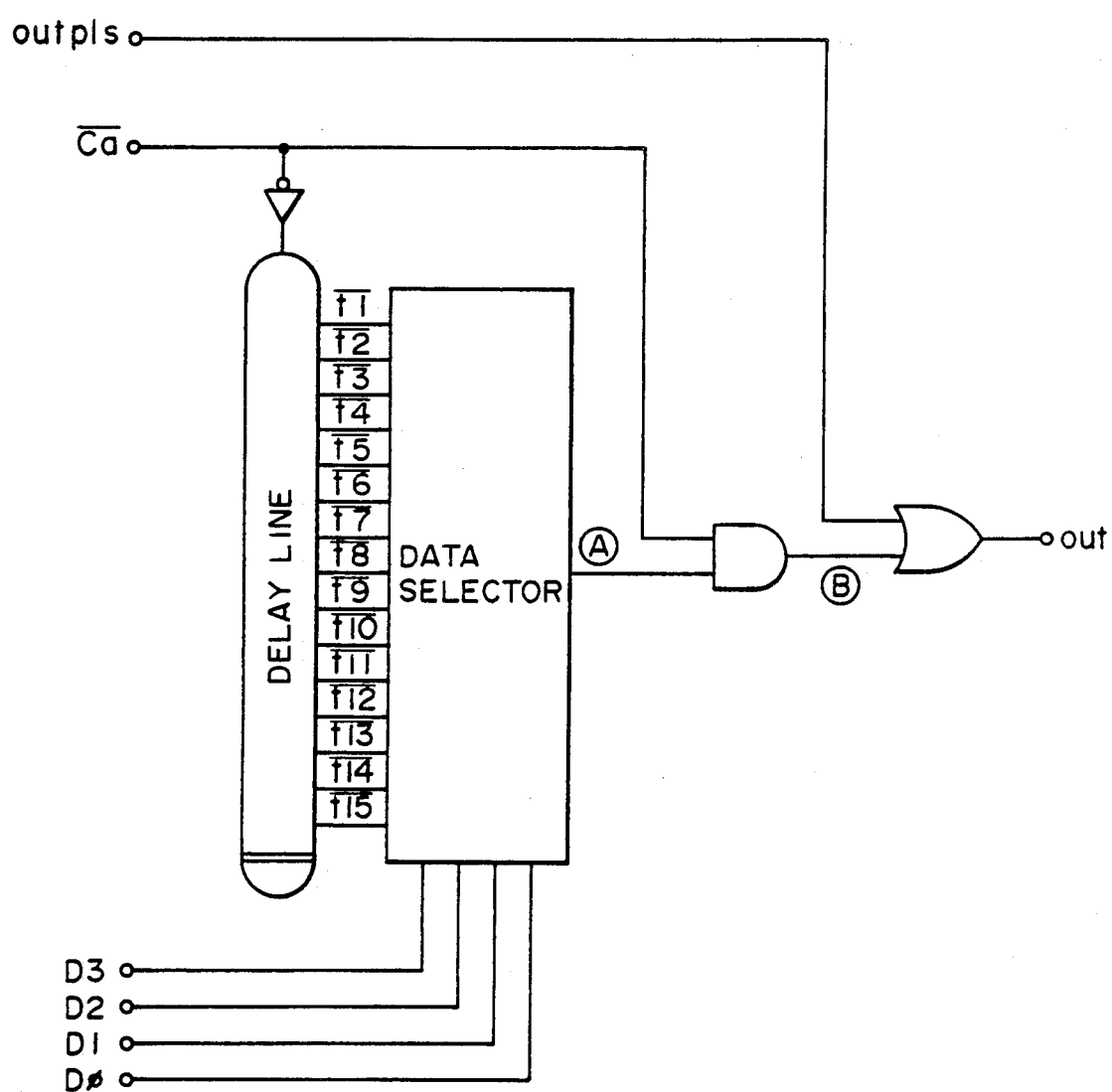
F I G . 22

FIG. 23

| D3 D2 D1 D0 | Ⓐ | out | FUNCTION |
|---|---|---|---|
| 0 0 0 0 | 0 | out pls | WITHOUT ADDITION |
| 0 0 0 1 | $\overline{t1}$ | (Ca * $\overline{t1}$) or out pls | 1/16 X 1/16 CLK IS ADDED |
| 0 0 1 0 | $\overline{t2}$ | (Ca * $\overline{t2}$) or out pls | 1/8 X 1/16 CLK IS ADDED |
| 0 0 1 1 | $\overline{t3}$ | (Ca * $\overline{t3}$) or out pls | 3/16 X 1/16 CLK IS ADDED |
| 0 1 0 0 | $\overline{t4}$ | (Ca * $\overline{t4}$) or out pls | 1/4 X 1/16 CLK IS ADDED |
| 0 1 0 1 | $\overline{t5}$ | (Ca * $\overline{t5}$) or out pls | 5/16 X 1/16 CLK IS ADDED |
| 0 1 1 0 | $\overline{t6}$ | (Ca * $\overline{t6}$) or out pls | 3/8 X 1/16 CLK IS ADDED |
| 0 1 1 1 | $\overline{t7}$ | (Ca * $\overline{t7}$) or out pls | 7/16 X 1/16 CLK IS ADDED |
| 1 0 0 0 | $\overline{t8}$ | (Ca * $\overline{t8}$) or out pls | 1/2 X 1/16 CLK IS ADDED |
| 1 0 0 1 | $\overline{t9}$ | (Ca * $\overline{t9}$) or out pls | 9/16 X 1/16 CLK IS ADDED |
| 1 0 1 0 | $\overline{t10}$ | (Ca * $\overline{t10}$) or out pls | 5/8 X 1/16 CLK IS ADDED |
| 1 0 1 1 | $\overline{t11}$ | (Ca * $\overline{t11}$) or out pls | 11/16 X 1/16 CLK IS ADDED |
| 1 1 0 0 | $\overline{t12}$ | (Ca * $\overline{t12}$) or out pls | 3/4 X 1/16 CLK IS ADDED |
| 1 1 0 1 | $\overline{t13}$ | (Ca * $\overline{t13}$) or out pls | 13/16 X 1/16 CLK IS ADDED |
| 1 1 1 0 | $\overline{t14}$ | (Ca * $\overline{t14}$) or out pls | 7/8 X 1/16 CLK IS ADDED |
| 1 1 1 1 | $\overline{t15}$ | (Ca * $\overline{t15}$) or out pls | 15/16 X 1/16 CLK IS ADDED |

| [INPUT DATA] D4~D0 | D4' | D3' | D2' | D1' | D0' | [CONVERSION DATA] D4'~D0' |
|---|---|---|---|---|---|---|
| 0 | 0 | 0 | 0 | 0 | 0 | 0 |
| 1 | 0 | 0 | 0 | 0 | 1 | 1 |
| 2 | 0 | 0 | 0 | 1 | 0 | 2 |
| 3 | 0 | 0 | 0 | 1 | 1 | 3 |
| 4 | 0 | 0 | 1 | 0 | 0 | 4 |
| 5 | 0 | 0 | 1 | 0 | 1 | 5 |
| 6 | 0 | 1 | 0 | 0 | 0 | 9 |
| 7 | 0 | 1 | 0 | 0 | 1 | 10 |
| 8 | 0 | 1 | 0 | 1 | 0 | 11 |
| 9 | 0 | 1 | 0 | 1 | 1 | 12 |
| 10 | 0 | 1 | 1 | 0 | 0 | 13 |
| 11 | 0 | 1 | 1 | 0 | 1 | 14 |
| 12 | 1 | 0 | 0 | 0 | 0 | 19 |
| 13 | 1 | 0 | 0 | 0 | 1 | 20 |
| 14 | 1 | 0 | 0 | 1 | 0 | 21 |
| 15 | 1 | 0 | 0 | 1 | 1 | 22 |
| 16 | 1 | 0 | 1 | 0 | 0 | 23 |
| 17 | 1 | 0 | 1 | 0 | 1 | 24 |
| 18 | | | | | | |

| INPUT DATA | AZ | A1 | A0 | PO |
|---|---|---|---|---|
| 0 ～ 255 | / | / | / | Pw (PULSE WIDTH MODULATION) |
| 256 | 0 | 0 | 1 | Pw + (Pmax − Pw)/8 |
| 257 | 0 | 1 | 0 | Pw + (Pmax − Pw)/4 |
| 258 | 0 | 1 | 1 | Pw + 3(Pmax − Pw)/8 |
| 259 | 1 | 0 | 0 | Pw + (Pmax − Pw)/2 |
| 260 | 1 | 0 | 1 | Pw + 5(Pmax − Pw)/8 |
| 261 | 1 | 1 | 0 | Pw + 3(Pmax − Pw)/4 |
| 262 | 1 | 1 | 1 | Pmax |

F I G. 32
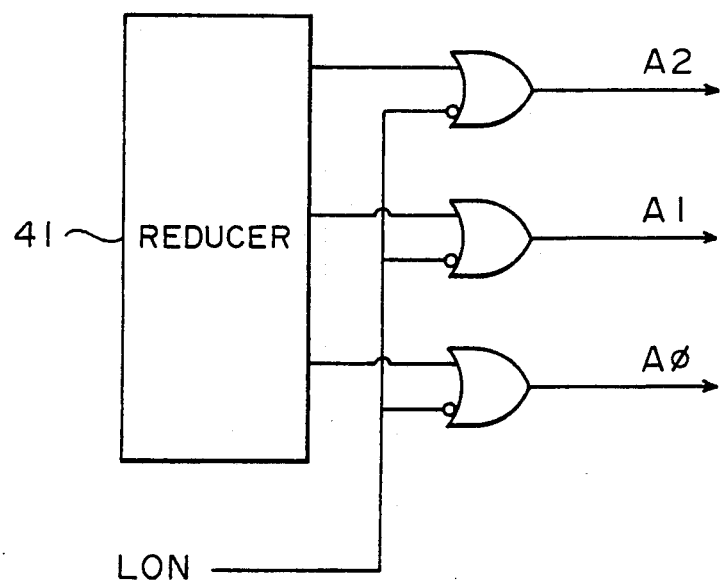
F I G. 34
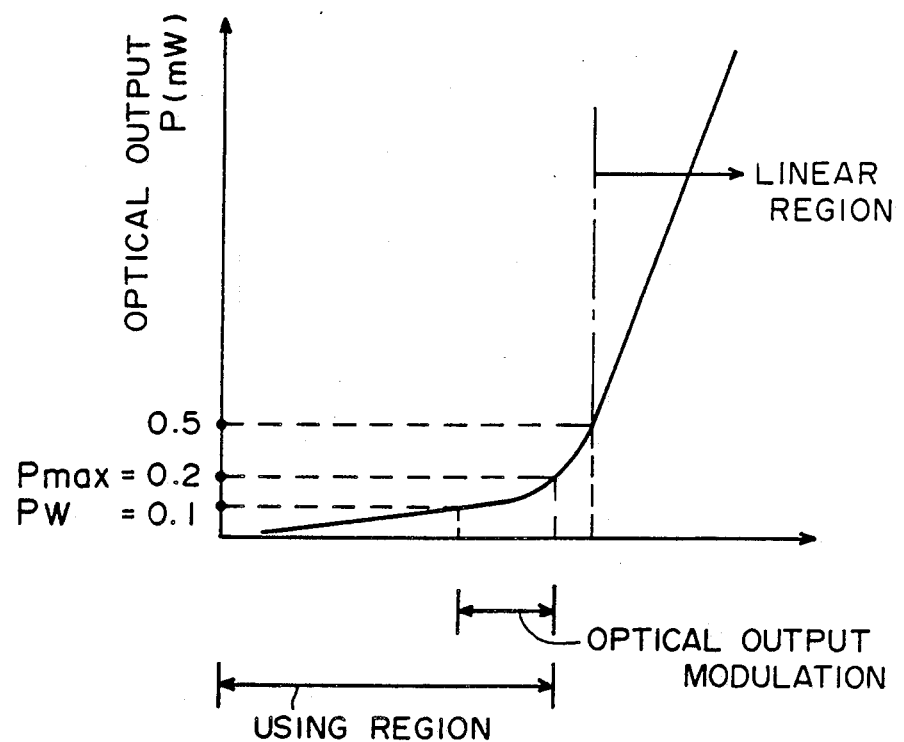

F I G . 41
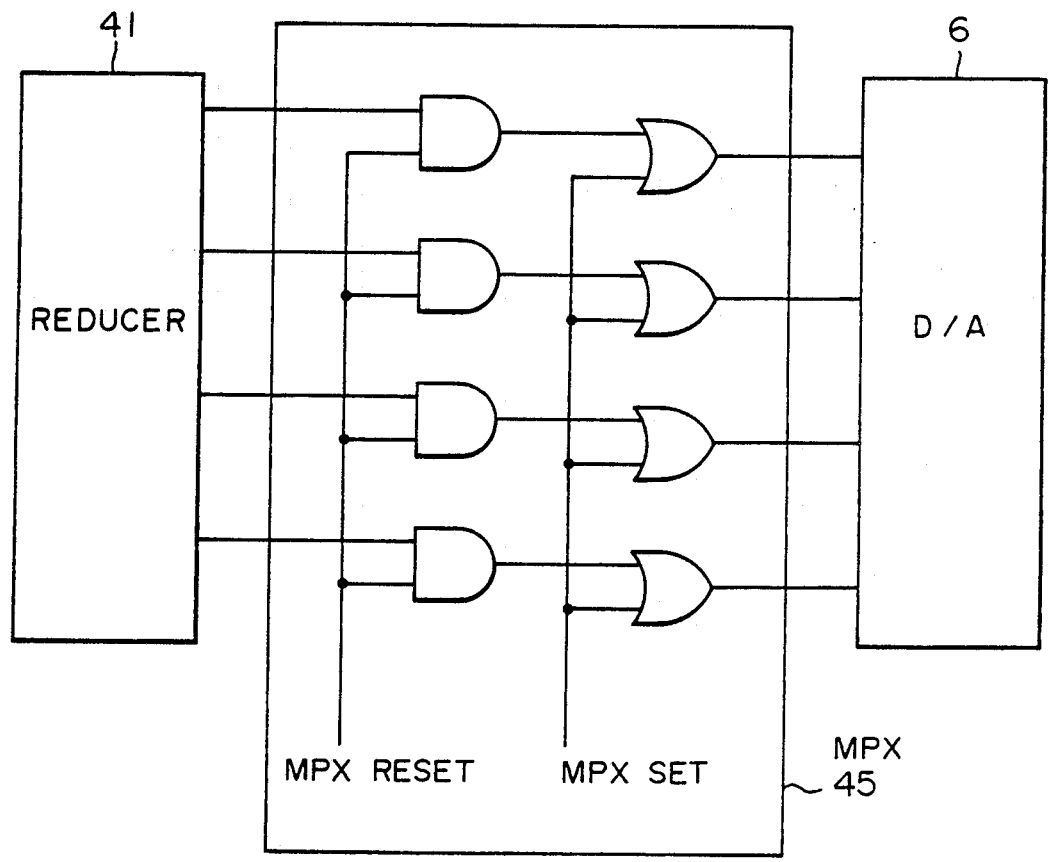
F I G . 42
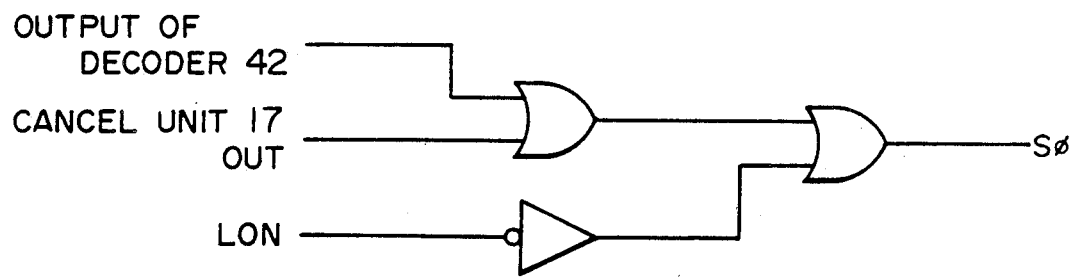

F I G . 44
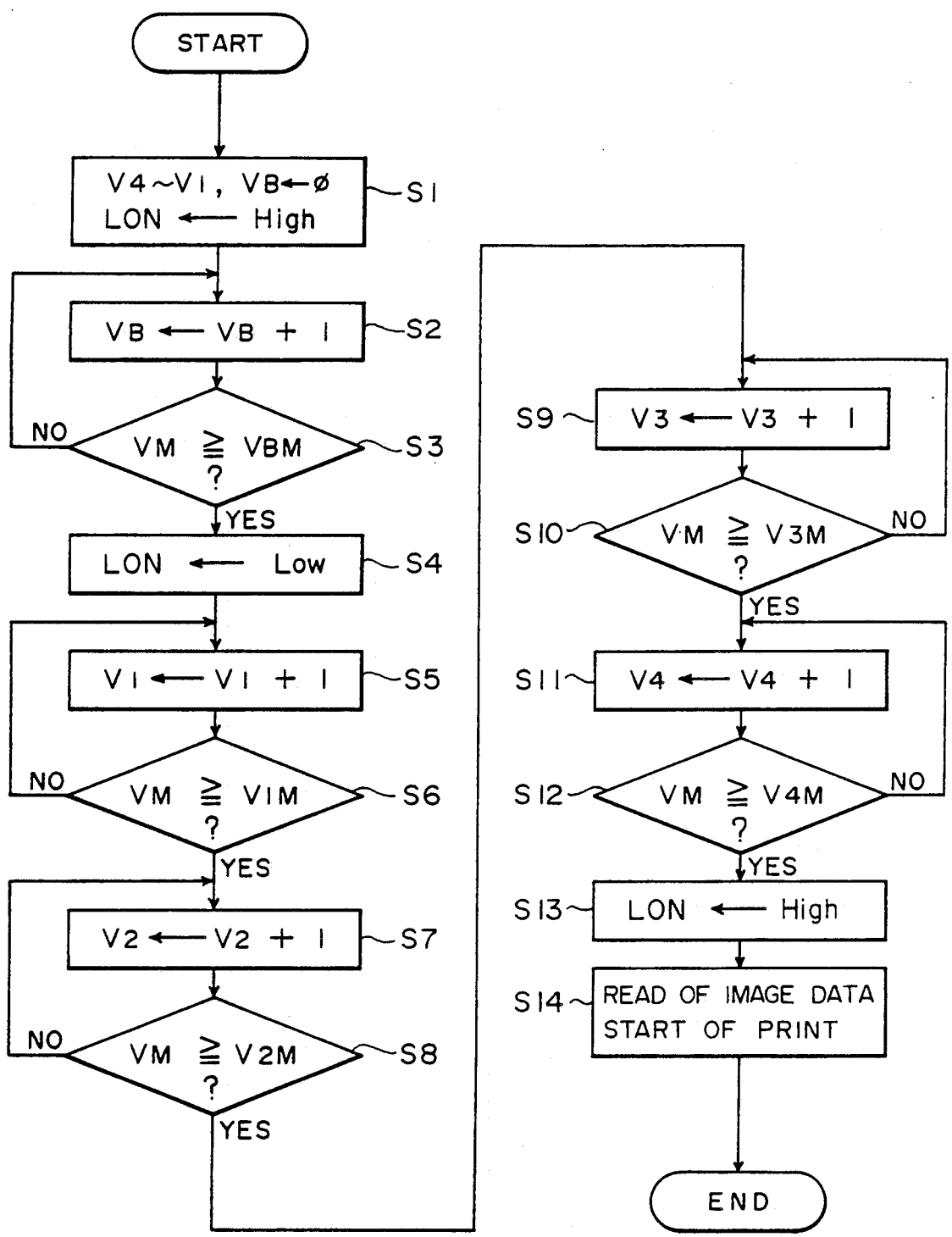

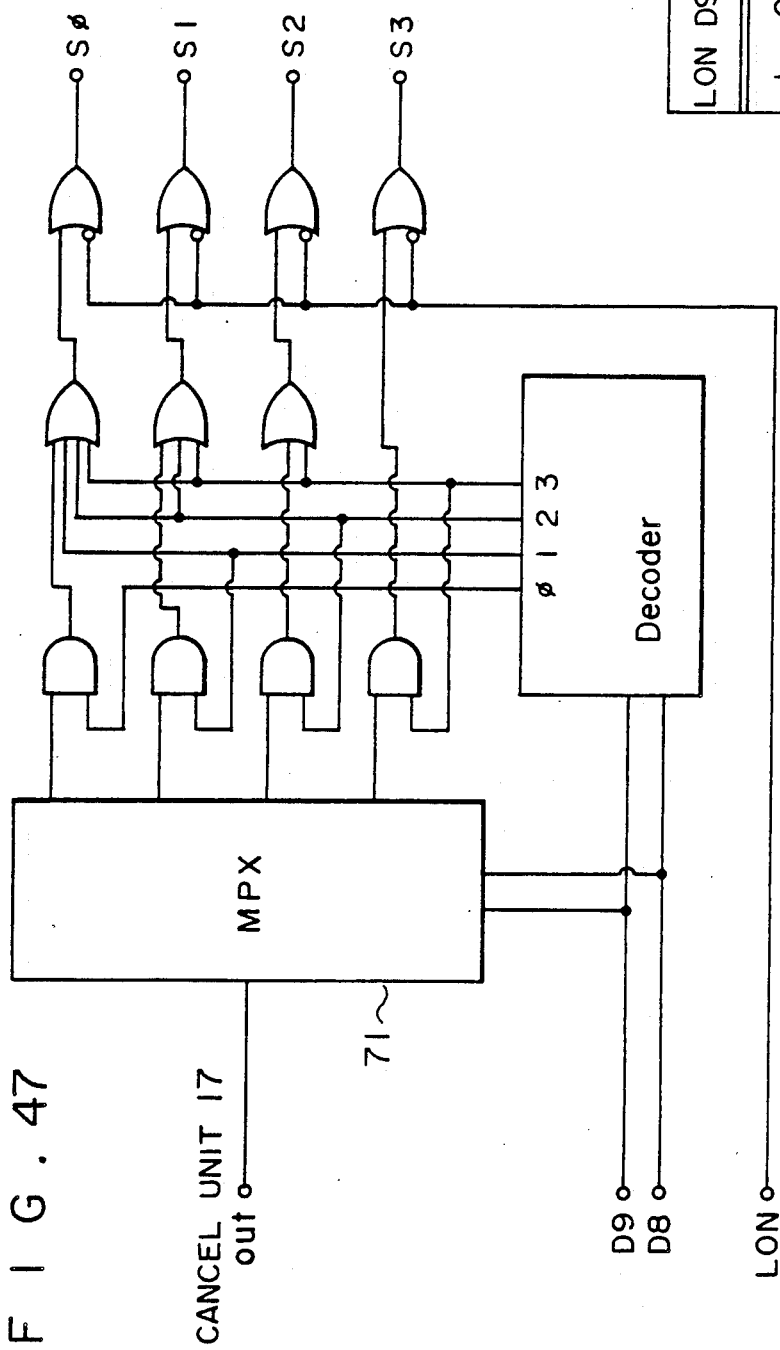

SEMICONDUCTOR LASER DRIVING APPARATUS

BACKGROUND OF THE INVENTION

1. Field of the Invention

This invention relates to a semiconductor laser driving apparatus. More particularly, the present invention relates to improved technique of a driving apparatus for controlling the irradiating energy or the intensity of a laser beam (optical output) from a semiconductor laser to obtain a continuous gradation.

2. Description of the Prior Art

There has been known conventionally a laser printer or the like which makes intensity modulation of a laser beam generated by a semiconductor laser (laser diode; LD) by an optical modulator disposed outside and effects exposure scanning on a photo-sensitive material to obtain tonal images. The following method is known which obtains images having continuous gradation (not the images by the Dither method but those images in which one pixel has density information) on a photosensitive material by directly controlling a current to be supplied to the semiconductor laser so as to control the optical output of the semiconductor laser without using the external modulator described above.

The semiconductor laser has predetermined characteristics between a current supplied thereto and its optical output. Therefore, if the current is controlled by a degree corresponding to a required gradation, the optical output can be controlled directly without using the external modulator, and 256 ($2^8$) gradations, for example, can be obtained by dividing the current by 256 steps.

Continuous gradation can be obtained, too, by keeping constant the current to be supplied to the semiconductor laser as well as its optical output and variably controlling the pulse width of one pixel clock. When, for example, one pixel clock is 300 ns (maximum exposure time), time resolution of 300 steps can be obtained by controlling the pulse width from 1 ns to 300 ns by every 1 ns, and as high as 300 continuous gradations can be obtained by the exposure time control of the 300 steps (refer to Japanese Patent Laid-Open Nos. 152372/1981, 58068/1986), though it depends on the property of the photosensitive member.

In case that the pulse width of one pixel clock is controlled as described above, the pulse width can be changed, too, by analog processing besides the digital processing described above.

Furthermore, optical quantity levels of $2^N$ levels can be obtained by preparing N current sources having mutually different current values as current sources for the semiconductor laser and combining them digitally (Japanese Patent Laid-Open No. 184773/1988).

A multi-stage gradation can also be obtained by modulating the optical output of the semiconductor laser together with the exposure time as shown in (Japanese Patent Laid-Open No. 124921/1986).

In accordance with the structure for obtaining the continuous gradation by dividing and controlling the current in accordance with the required number of gradations as described above, however, the current difference in the optical output range is 14 mA if the output characteristics of the semiconductor laser used are such as a dot line shown in FIG. 35 and the range of use of the optical output is from 0 to 3 mW, for example. If the gradations of 256 steps must be obtained here, the current must be controlled with accuracy of 14 mA/256=55 $\mu$A. Therefore, if a structure shown in FIG. 36 which converts digital input image data by D/A converters and supplies a current to a semiconductor laser (LD) through an amplifier, high speed and high precision D/A converters must be employed as the D/A converters. Thus, there remain the problems that the cost of apparatus becomes high and necessary accuracy cannot be secured so easily.

When the pulse width of one pixel clock is controlled variably by a digital processing, division (unit increase time) of the pulse width must be set finely in order to obtain sufficient gradations only from the pulse width. When gradations of 1,024 steps, for example, must be obtained, division of the pulse width becomes 300 ns/1,024=0.3 ns if one pixel clock is 300 ns, and time resolutions of a GHz order is required. It is difficult to attain such time resolution by ordinary circuit technique, and the method of variably changing the pulse width described above is effective when the required frequency of the pixel clock is low (in the KHz order) but its practically drops when the required frequency becomes high.

When the variable control of the pulse width is made by the analog processing as described above, a triangular wave in synchronism with the pixel clock may be generated and is compared with the analog value of the input data to convert it to the pulse width. Thought the high frequency pulse is not necessary in this case, a triangular wave which has an accurate slope and is therefore difficult to generate must be generated and this method is inferior in the aspect of accuracy to the digital processing.

In the method of obtaining the continuous gradation by use of a plurality of current sources, 10 current sources are necessary to obtain the gradation of 1,024 ($2^{10}$) steps, for example, so that the circuit becomes complicated and the increase in the cost of production is unavoidable. In the method which uses a plurality of current sources such as the one disclosed in Japanese Patent Laid-Open No. 184773/1988, for example, the characteristics of the optical output of the semiconductor laser and those of the current are assumed to be those shown in FIG. 37. However, whereas the optical output hardly changes within a range (natural emission region) below a boundary current (threshold current) at which the semiconductor laser starts oscillation as shown in the afore-mentioned FIG. 35, the optical output increases abruptly within a range (laser oscillation region) beyond this boundary current. For this reason, it cannot be said that the optical quantity levels of $2^N$ can always obtained when the number of current sources is N.

If the current is divided (into $I_0$, $I_1$, ...) so that the optical output has equidistant gaps $\Delta Po$ as shown in FIG. 38, for example, $I_0$, $I_1$, $I_2$ in the non-linear region are not equal to one another while $I_3 \sim I_7$ in the linear region are equal to one another. Accordingly, it is not possible to make the control (the control based on the premise that the relation between the optical output and the current in linear) by assuming the least significant bit number (LSB) used for ordinary D/A converters or the like is A, the next bit number is 2A and so forth with subsequent bit numbers being 4A, ..., $2^{N-1}$ and by combining these units to obtain $2^N$ optical outputs.

In the example shown in FIG. 38, LSB=$I_0$ but a current corresponding to the input data 2 is $I_0+I_1\neq 2I_0$, a current corresponding to the input data 3 is $I_0+I_1+I_2 \neq 3I_0$ and furthermore, a current corresponding to the input data 4 is $I_0+I_1+I_2+I_3 \neq 4I_0$. Accordingly, $2^N$ optical outputs cannot be obtained from $(N-1)$ units of A, 2A, 4A, ..., $2^{N-1}$A described above.

In an embodiment of the Japanese Patent Laid-Open No. 124921/1986, for example, the optical output of the semiconductor laser and the exposure time are modulated together, and input digital data are divided into lower order bits and upper order bits, so that the pulse width is controlled by the lower order bits and the optical output (supply current) is controlled by the upper order bits. In this case, waveforms of current flowing through the semiconductor laser are shown in FIGS. 39 and 40, however, there is a problem whether the simplicity of the density actually obtained when the optical output is switched can be guaranteed or not.

Specifically, in case of FIGS. 39 and 40, it is difficult to obtain stably a relation of "$P_1 \times$ density obtained during the maximum time to (1 pixel time)$\leq P_2 \times$ density obtained during the minimum time $\Delta t$" in consideration of the fluctuation or change with time in property of the photosensitive material, and the change with time of process etc. Accordingly, the gradation property is deteriorated and the density can not be reproduced with a high fidelity, if the simplicity of density can not be obtained.

SUMMARY OF THE INVENTION

In view of the problems described above, an object of the present invention is to provide a semiconductor laser driving apparatus which can maintain the simplicity of density and obtain an exposure energy of a multi-gradation without increasing the resolution of drive current.

To accomplish the object described above, the present invention constitutes a semiconductor laser driving apparatus wherein an irradiating energy of a semiconductor laser is adjusted multi-stepwise by controlling an irradiating time and an optical output of the semiconductor laser.

Specifically, in the semiconductor laser driving apparatus of the present invention, the irradiating energy is adjusted by varying the irradiating time within the maximum irradiating time while maintaining at a constant value the optical output when the irradiating energy is lower than a predetermined value, whereas the irradiating energy is adjusted by increasing the optical output more than said constant value while fixing the irradiating time to the maximum irradiating time when the irradiating energy is higher than said predetermined value.

The optical output of the semiconductor laser can be increased by increasing a bias optical output.

Further, the optical output of the semiconductor laser can also be increased by changing selectively current sources for a plurality of weighted semiconductor laser connected in parallel with one another.

Furthermore, it is preferably to insert an optical output decay means in a light path of the semiconductor laser so that the optical output can be controlled in a region where the optical output is varied linearly with respect to the change of a supply current when the irradiating energy is adjusted by controlling the optical output.

In the semiconductor laser driving apparatus of the present invention, a kind of irradiating energy according to the step of irradiating time control (in case of the exposure of photosensitive material, it is gradation) can be obtained by varying the irradiating time within the maximum irradiating time (1 pixel clock, for example) while maintaining the optical output of the semiconductor laser at a constant value, when a required irradiating energy is lower than a predetermined value. In case that the required irradiating energy can not be obtained even if the semiconductor laser irradiates for the maximum irradiating time under said constant optical output, the irradiating time is fixed to the maximum irradiating time and the optical output is increased more than said constant value to obtain a large irradiating energy. In this case, a kind of irradiating energy corresponding to the control step of the optical output (in case of the exposure of photosensitive material, it is gradation) can be obtained. As a result, a final control step of the irradiating energy is set as the sum of the step numbers of the irradiated energy controlled in irradiating time and optical output, respectively.

The irradiating energies obtained by the irradiating time control and by the optical output control, respectively, are not overlapped, because when the optical output is controlled, the optical output is increased more than that maintained when the irradiating time is controlled.

Another object of the present invention is to provide a semiconductor laser driving apparatus which can accurately obtain necessary and sufficient gradation (density resolution) by use of a minimum necessary number of current sources and moreover, is not affected by non-linear portions of the optical output of a semiconductor laser with respect to a current change even if such non-linear portions exist.

To accomplish the object desired above, the present invention constitutes a semiconductor laser driving apparatus by a plurality of current generation means whose current generation is controlled in accordance with input pulse signals, a semiconductor laser connected in series with parallel connection terminals of these current generation means; and current control means for adjusting a supply current to the semiconductor laser by controlling the pulse widths of the input pulse signals to the plurality of current generation means, respectively.

The plurality of current generation means described above are preferably composed of voltage/current conversion circuits for converting an input voltage to a current and outputting the current.

It is further preferred to dispose sync signal generation means for generating a sync signal for the input pulse signal by use of a frequency divider, and first pulse width fine division control means for setting the pulse width of the input pulse signal by the current control means on the basis of a high frequency signal inputted to the frequency divider.

It is advisable to dispose second pulse width fine division control means for setting the pulse width of the input pulse signal by the current control means by finely dividing a predetermined fundamental pulse width, by delaying a predetermined high frequency signal and calculating the logical sum or logical product between the delay signal and the predetermined fundamental pulse width.

It is further preferred to dispose optical output detection means for detecting the optical output of the semiconductor laser and reference current setting means for setting variably the generation current values of the plurality of the current generation means on the basis of the optical output detected by the optical output detection means.

It is also possible to dispose current generation timing control means which deviates the rise and fall timings of the current generation in each of the plurality of current generation means.

The current generation of the plurality of current generation means is controlled in accordance with the input pulse signal and the semiconductor laser is connected in series with their parallel connection terminal so that the sum of the currents from the plurality of current generation means is supplied to the semiconductor laser.

The current control means controls the current generation in each of the plurality of current generation means by controlling the pulse width of the input pulse signal to each of the current generation means and thus controls the supply current to the semiconductor laser.

In other words, the current control means regulates the supply current to the semiconductor laser as the total current of each current generation means by controlling the generated current by each current generation means by controlling the pulse width of the input pulse signal. If, for example, the pulse width of the input pulse signal to one remaining current generation means can be changed by 256 steps while a predetermined number of current generation means are operated continuously, the optical output can be controlled by 256 steps.

Here, if the plurality of current generation means are composed of voltage/current conversion circuits for converting an input voltage to a current and outputting the current, the generated current value of each current generation means can be controlled by controlling the input voltage.

If sync signal generation means for generating a sync signal of the input pulse signal by use of a frequency divider is provided when the pulse width of the input pulse signal is controlled, the first pulse width fine division control means sets the pulse width of the input pulse signal by the current control means on the basis of the high frequency signal inputted to the frequency divider. Accordingly, a high frequency signal for fine division of the pulse width need not be generated separately.

The second pulse width fine division control means delays a predetermined high frequency signal, calculates the logical sum or logical product between the delay signal and a predetermined fundamental pulse width to divide finely the predetermined fundamental pulse width and thus sets the pulse width of the input pulse signal by the current control means. Accordingly, high precision pulse width resolution can be obtained by delaying the high frequency signal for a period of time corresponding to minimum resolution.

The reference current setting means sets variably the generated current value in each of the plurality of current generation means on the basis of the optical output of the semiconductor laser detected by the optical output detection means and obtains a desired optical output by adjusting the supply current to the semiconductor laser.

Furthermore, the current generation timing control means deviates the rise and fall timings of the current generation by each of the current generation means and avoids the occurrence of noise due to simultaneous ON/OFF of the plurality of current generation means.

These and other objects and novel features of the present invention will become more apparent from the following description when taken in conjunction with the accompanying drawings.

BRIEF DESCRIPTION OF THE DRAWINGS

FIG. 3 is a circuit diagram showing an example of voltage/current conversion circuits shown in FIG. 1;

FIG. 4 is a diagram showing an example of general characteristics of a photosensitive material exposed by a semiconductor laser;

FIG. 14 is a table showing comparatively input data and conversion results in the control characteristics shown in FIG. 13;

FIG. 16 is a time chart showing the control characteristics by the circuit shown in FIG. 15;

FIG. 17 is a table showing comparatively input data and conversion results in the control characteristics shown in FIG. 16;

FIG. 18 is a circuit diagram showing another example of a pulse width divider;

FIG. 19 is a time chart showing the control characteristics by the circuit shown in FIG. 18;

FIG. 22 is a circuit diagram showing another circuit example of the cancel unit shown in FIG. 1;

FIG. 23 is a table showing comparatively input data in the circuit shown in FIG. 22 and conversion results;

FIG. 32 is a circuit diagram showing a construction of an adjust circuit shown in FIG. 29;

FIG. 34 is a diagram showing the relation between an optical output control range and linear·non-linear regions of the semiconductor laser;

FIGS. 41 and 42 are circuit diagrams for explaining the present invention;

FIG. 44 is a flowchart showing control contents in the embodiment described above;

FIG. 45 is a diagram showing the characteristics of an optical output control in the embodiment described above;

FIG. 47 is a circuit diagram showing a circuit example of a select unit shown in FIG. 43;

FIG. 48 is a table showing comparatively input data in the circuit shown in FIG. 47 and conversion results;

DESCRIPTION OF THE PREFERRED EMBODIMENT

Figure 1:
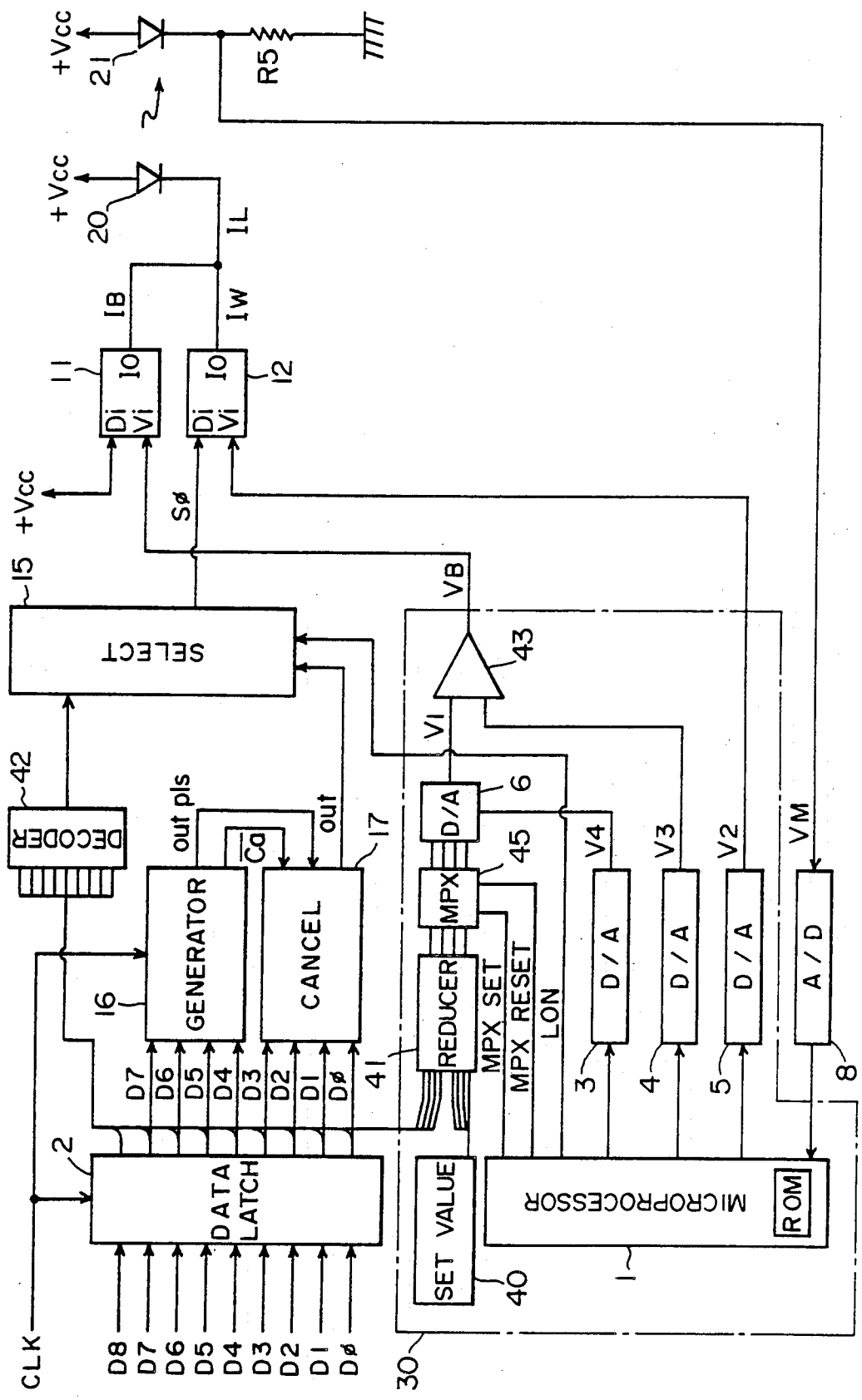
FIG. 1 is a circuit diagram showing a first embodiment of a semiconductor laser driving apparatus in accordance with the present invention.

Hereinafter, an embodiment of the present invention will be described.

The following embodiment is based on the assumption that a laser printer is constructed to obtain a continuous gradation on a photosensitive material by effecting an exposure scanning on the photosensitive material with a laser light while adjusting an exposure energy by controlling directly a current supplied to a semiconductor laser.

First of all, examples of characteristics of a photosensitive material which is subjected to exposure scanning by a semiconductor laser will be explained with reference to FIG. 4 before a semiconductor laser driving apparatus in accordance with the present invention is described.

In the diagram shown in FIG. 4, the ordinate represents a density D of the photosensitive material due to laser exposure and the abscissa does a pulse width of a supply current control signal (exposure time) Tw (ns). The diagram represents the characteristics at each time when the optical output (mW) of the semiconductor laser is changed, wherein the maximum exposure time (1 pixel clock) is 320 ns.

As is obvious from FIG. 4, the inclination of the density change with respect to the change of the pulse width Tw is steep due to the gamma characteristics of the photosensitive material at the portion which should be provided mostly with the gradation steps from the high light (density 0.4~0.5) to shadow (1.0~1.5) in comparison with other portions. When the optical output of the semiconductor laser is lowered, the inclination of the density change with respect to the pulse width Tw becomes gentle so that density control can be made accurately by controlling the pulse width Tw and gradation representation by the pulse width Tw becomes easy. When the optical output is low, however, the maximum density $D_{max}$ (density 1.6~1.8) cannot be obtained even when full exposure is made for one pixel clock period (320 ns). If the optical output is increased in order to obtain the maximum density $D_{max}$, the inclination of the density change with respect to the pulse width Tw becomes steep and the portions capable of contributing to the actual gradation become small. Therefore, sufficient density resolution cannot be obtained unless the division of the pulse width Tw (resolution) is below sub-nanosecond.

Figure 5:
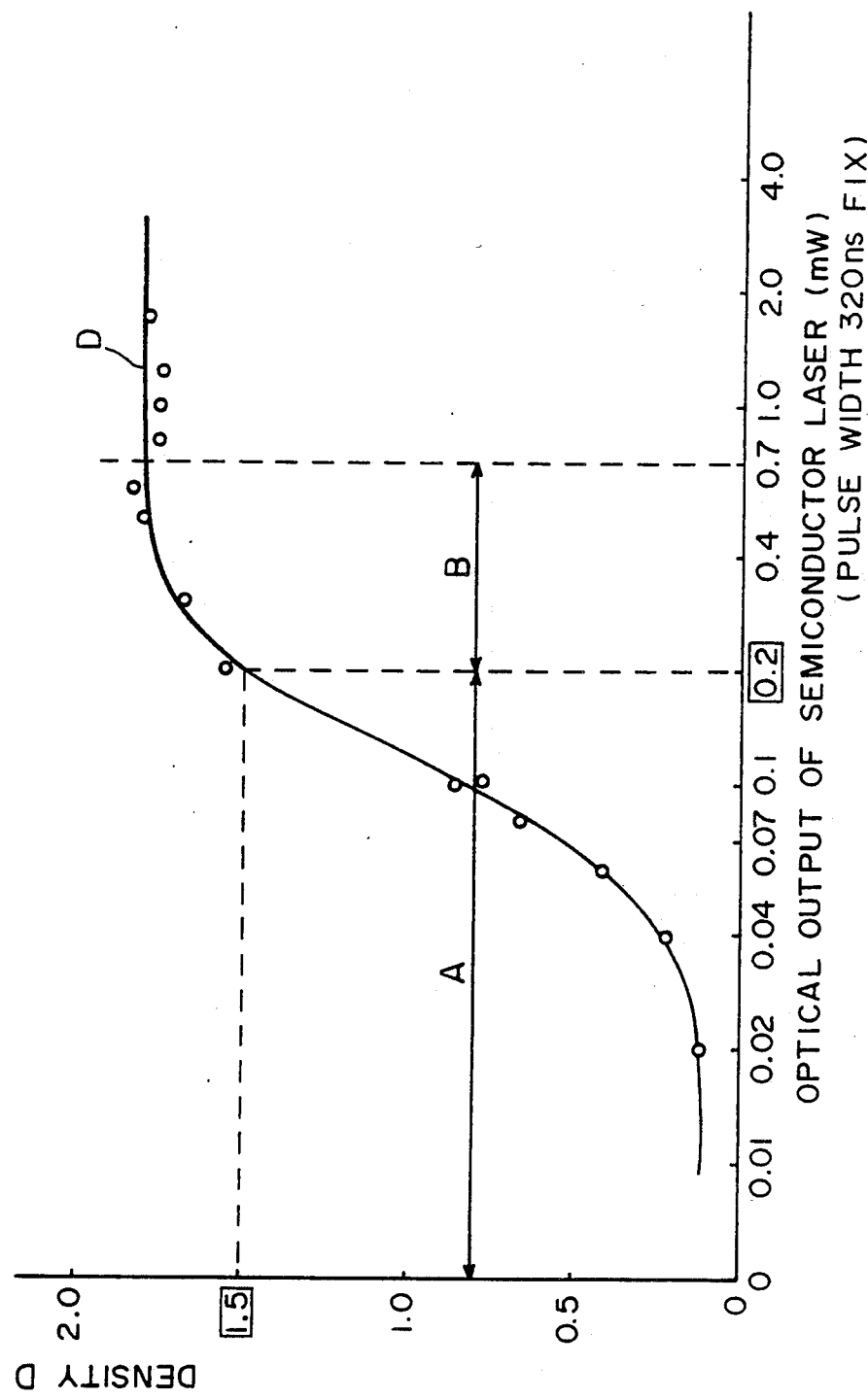
FIG. 5 is a diagram showing the relation between an optical output of the semiconductor laser and a density.

FIG. 5 shows characteristics of the semiconductor laser when the optical output thereof is varied with the maximum pulse width (320 ns) without modulating the pulse width Tw.

The comparison between FIGS. 4 and 5 show the fact that it is preferable to control at first the pulse width Tw with the optical output of the semiconductor laser of 0.2 mW and to increase the optical output when the pulse width becomes maximum (1 pixel clock) to obtain a high density.

Specifically, in FIG. 5, a portion A represents the pulse width Tw control, whereas a portion B represents the optical output control. In this case, a curve C in FIG. 4 (optical output of 0.2 mW) is combined with a curve D in FIG. 5 (optical output of more than 0.2 mW), so that the simplicity of density can positively guaranteed. Further, it is easy to obtain a large resolution at the portion of the curve C in FIG. 4 wherein the gradation is obtained by the pulse width Tw control, because the rise of the density D with respect to the pulse width Tw is blunt. Moreover, in case of the optical output control, the resolution coarser than that in the case of the optical output control only can be permitted, because the density control range due to the optical output control is narrow, so that it is not necessary to increase the resolution of the drive current. In the above case, furthermore, it is sufficient to obtain a density of as large as 1.5 with the maximum pulse width, so that it is not necessary to increase more than necessity the optical output at the pulse width Tw control. As a result, the resolution due to the pulse width Tw control can be maintained, and the maximum density can be obtained even if the resolution due to the pulse width Tw control is maintained. Accordingly, such problems that it is difficult to increase the density resolution and to obtained the maximum density by only the pulse width Tw control can be solved.

Figure 35:
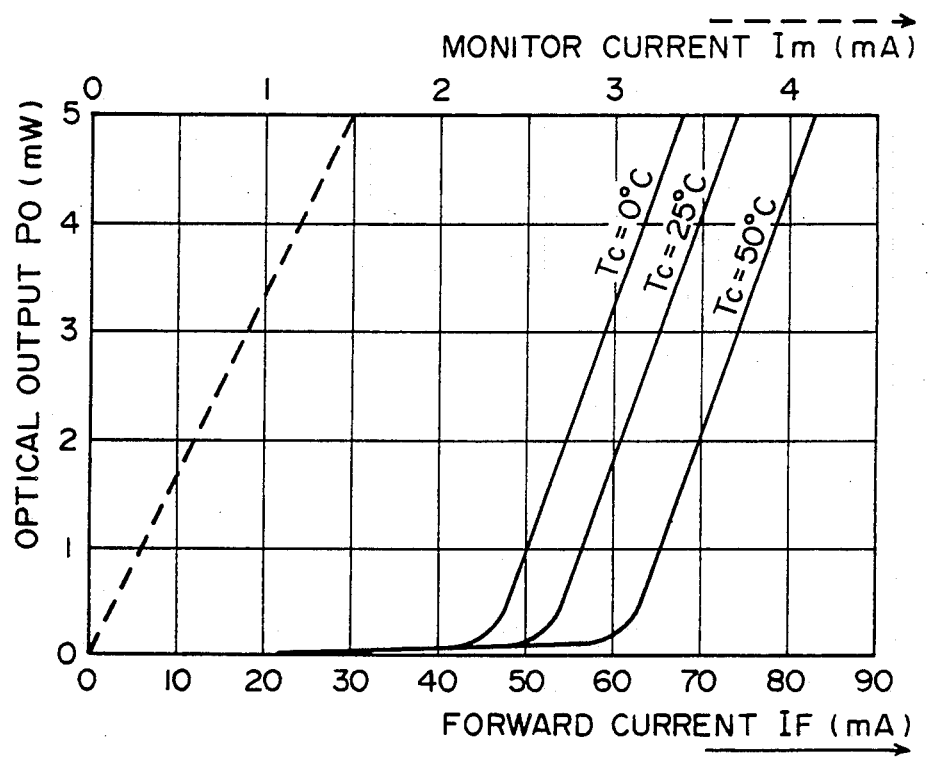
FIG. 35 is a diagram showing the relation between a current and an optical output of the semiconductor laser.
Figure 36:
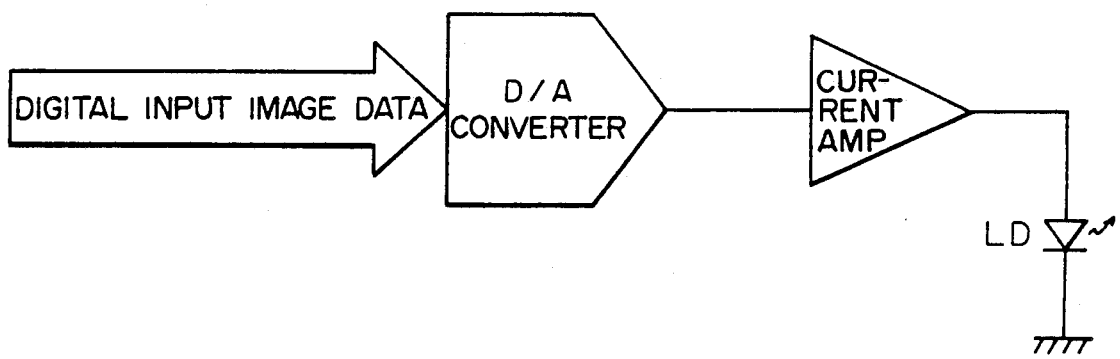
FIG. 36 is a system diagram showing a conventional example of a semiconductor laser driving apparatus.

In said embodiment, the maximum density $D_{max}$ is 1.8, whereas the density at the turning point between the pulse width Tw control and the optical output control is 1.5, so that the density difference $\Delta D = 1.8 - 1.5 = 0.3$ becomes the density control range due to the optical output control. Accordingly, it is sufficient to have an optical output resolution of $0.3/0.01 = 30$ steps, if the density resolution is 0.01 for example. The optical output change in said range is 0.2 to 0.7 mW, and accordingly if it is assumed that the optical output per one step density is linear, for one step the optical output becomes $(0.7-0.2)/30 = 0.016$ mW. The division width of current corresponding to said 0.016 mW becomes to 0.016 mW/0.24 = 67 μA, if the inclination property shown in FIG. 35 is 0.24 mW/mA.

On the other hand, in order to resolute all density range (0.1-1.8) with resolution of 0.01 by only the optical output control (current control), steps of $(1.8-0.1)/0.01 = 170$ are required, and since the optical output therebetween is $0.1 \rightarrow 0.7$ mW the resolution of $(0.7-0.01)/170 = 0.004$ is required per one step density. The division width of current corresponding thereto becomes $0.004/0.24 = 17$ μA, if it is calculated as mentioned above. This means that the current resolution of four times that in case of resolving the range more than the density of 1.5 by the optical output control is required and that the necessary step number is increased from 30 (5 bits) to 170 (8 bits) to require a large number of bits of D/A converter. Accordingly, it is understood that it is better to carry out the optical output control under more than density of 1.5 in view of bit number of D/A converter.

The driving method of the semiconductor laser will be summarized as follows.

Figure 6:
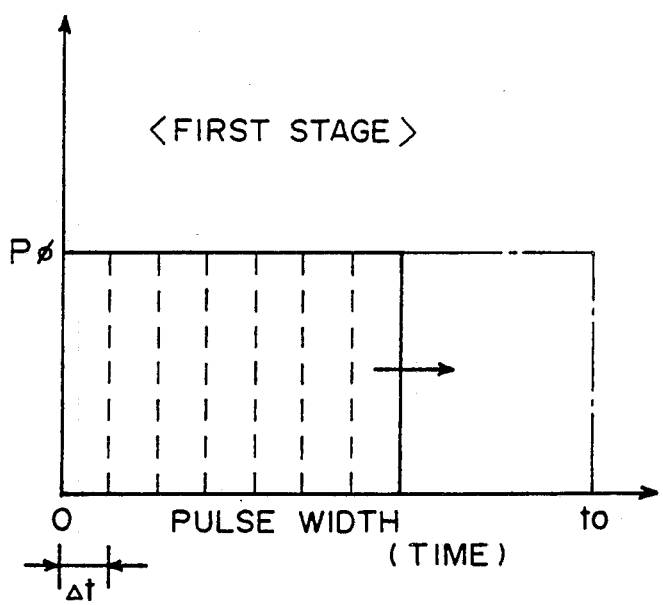
FIGS. 6 and 7 are diagrams useful for explaining basic control characteristics of the semiconductor laser driving apparatus of the present invention.
Figure 7:
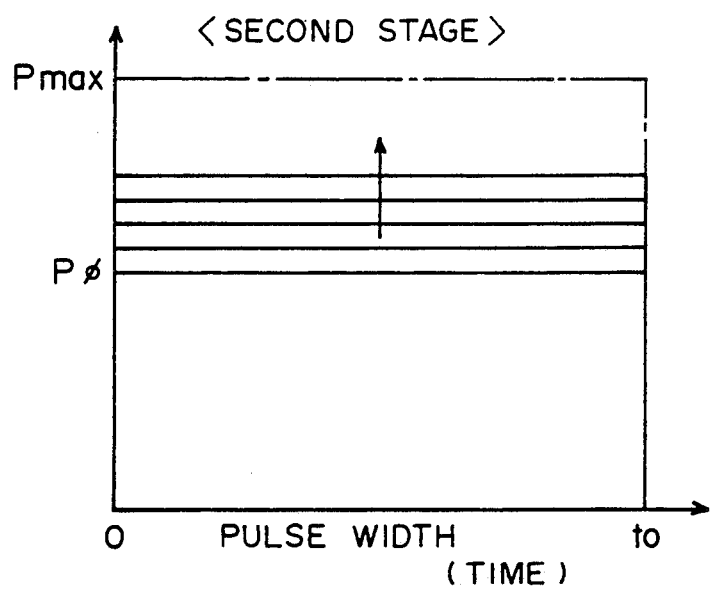

As shown in FIG. 6, the pulse width control (irradiating time control within the maximum irradiating time) is carried out under the constant optical output as a first stage (pulse width control) to increase the pulse width with the resolution of unit pulse time until the pulse width reaches the maximum pulse width (1 pixel clock; maximum irradiating time) according to the increase of the necessary density. In case of the image data region for which a required density (exposure energy) is not obtained even if the maximum pulse width is applied under the constant optical output, as a second step (optical output control) the maximum density is obtained by increasing at every steps the optical output in the state that the pulse width is maintained at the maximum pulse width (maximum irradiating time), after the pulse width is increased to the maximum pulse width (1 pixel clock), as shown in FIG. 7.

The driving apparatus of the semiconductor laser in said driving system will be explained concretely.

Figure 8:
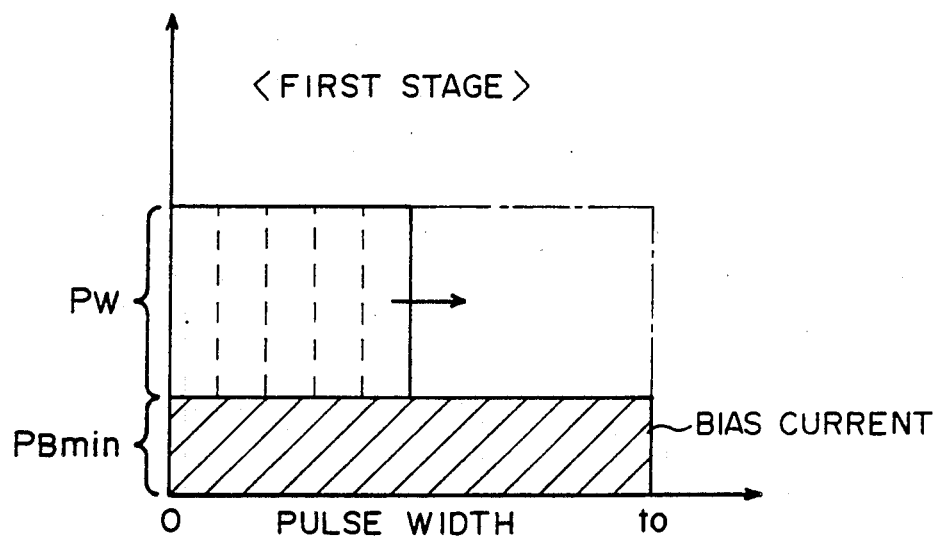
FIGS. 8 and 9 are diagrams showing control characteristics of a first embodiment of the present invention.
Figure 9:
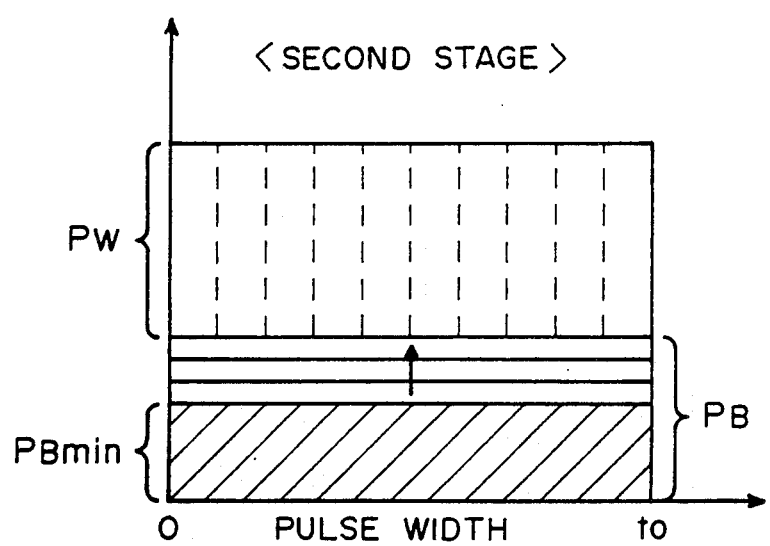

An apparatus of an embodiment is composed of a pulse width modulating circuit, and a current switch and a variable bias current source connected to the pulse width modulating circuit. In this embodiment, the optical output of the semiconductor laser is increased by increasing the bias current (bias optical output $P_B$), after the pulse width reaches the maximum pulse width, as shown in FIGS. 8 and 9. The minimum value $P_{Bmin}$ of said bias current (corresponding to the minimum exposure laser power) is set to a value so that the optical output cannot expose the photosensitive material. The minimum value of the bias current may be set to zero.

Figure 2:
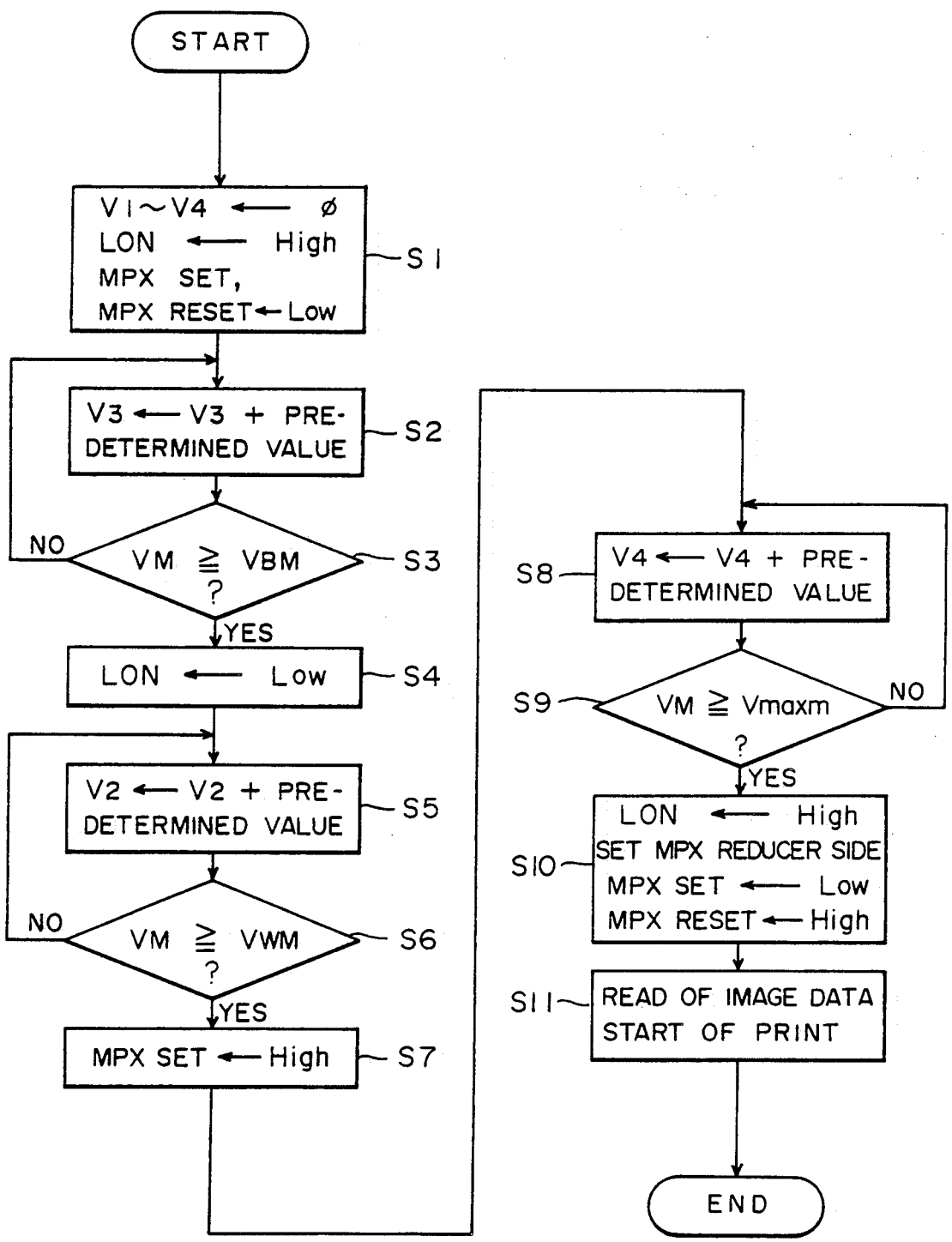
FIG. 2 is a flowchart showing control contents in the embodiment described above.

FIG. 1 shows a circuit construction of the semiconductor laser driving apparatus in accordance with the present invention. A data latch circuit 2 latches temporarily digital input image data D$\phi$-D8. A microprocessor (MPU) 1 has a plurality of input and output ports and executes the control of the laser beam output in accordance with the present invention by following the control procedures shown in the flowchart of FIG. 2. The control procedures (control routines) shown in the flowchart of FIG. 2 are in advance stored in an internal ROM (Read-Only Memory) of the microprocessor.

A D/A converter 6 is used for increasing and decreasing the current for the optical output (brightness modulation), and an output of the D/A converter is added to an output of a D/A converter 4 for setting a bias current described later in an adder 43. A reducer 41 subtracts input digital data indicating a turning point between the pulse width control and the optical output control, so that a subtraction result of the above and signals (MPX SET, MPX RESET) from the microprocessor 1 are changed over in a MPX 45, of which output is applied to the D/A converter 6.

D/A (digital/analog) converters 3-5 are connected to the output ports of the microprocessor 1 and convert the digital data representing the voltage values outputted from the microprocessor 1 to analog voltages $V_2$-$V_4$.

An output of the D/A converter 3 is used for controlling a span of the D/A converter and controls the inclination of the output voltage with respect to the input digital data of the D/A converter 6. The output of the D/A converter 4 to be added with the output of the D/A converter 6 in the adder 43 controls an offset bias value. Further, an output of the D/A converter 5 controls a laser power of a semiconductor laser 20 when it is pulse width modulated, as explained later.

The constituted elements 1, 3-5 described above constitute a voltage application circuit 30 for applying mutually different voltages to later-appear two voltage/current conversion circuits 11 and 12.

An A/D (analog/digital) converter 8 is connected to the input port of the microprocessor, converts a voltage $V_M$ from a later-appearing photo-diode 21 to digital data and sends it to the microprocessor 1. As will be described later, the microprocessor 1 adjusts and controls the data (voltage values) to be outputted to the D/A converters 3-5 in accordance with the digital data (measurement values) sent from the A/D converter 8 in accordance with the output of the photo-diode 21.

The two voltage/current conversion circuits 11 and 12 convert the voltage values to the current values, and each has an input voltage terminal Vi, an output current terminal Io and an input control terminal Di for controlling switching of the output current terminals Io described above are connected in series with this parallel connection terminal. The sum of the currents outputted from the voltage/current conversion circuits 11 and 12 is supplied to this semiconductor laser 20.

A generator unit 16 divides a pixel clock signal CLK (sync signal) into 16 signals, and generates 16 pulse widths in accordance with input data D4-D7. A cancel unit 17 has the function of correcting the pulse widths obtained by the generator unit 16 with accuracy of 1/16 of the pulse width which is 1/16 of the pixel clock signal CLK by use of a delay line or the like. Thus, the generator unit 16 and the cancel unit 17 together generate $2^4 \times 2^4 = 2^8$ pulse widths.

A decoder 42 decodes input digital data and generates a high level signal to a select unit 15 when the density region is more than a predetermined value for increasing the optical output of the semiconductor laser 20.

Further, the select unit 15 determines whether a pulse width modulating signal is applied to the voltage/current conversion circuit 12 or not, and controls the voltage/current conversion circuit 12 according to the output of the decoder 42. Specifically, when the output of the decoder 42 is a low level, a pulse width control signal from the cancel unit 17 is applied to the voltage/current conversion circuit 12. When the output of the decoder 42 is a high level, a high level signal is always applied to the voltage/current conversion circuit 12 irrespective of the signal from the cancel unit 17. On the other hand, the output is changed to the high level forcibly by a LON signal from the microprocessor 1, as shown in FIG. 42. Further, the voltage/current conversion circuit 11 is always switched ON. As stated above, the reducer 14 subtracts from the input digital data digitally the input image data corresponding to the turning point between the pulse width modulation (first stage) and the optical output control (second stage) (it is stored to the set value 40 and corresponds to a predetermined irradiating energy of the input image data at the turning point), and a subtraction result is applied to the D/A converter 6.

The MPX 45 selects on of the outputs (MPX SET, MPX RESET) from the microprocessor 1 when the optical output is set initially by the microprocessor 1 and the image data from the reducer 41 and supplied to the D/A converter 6. Specifically, at the optical output setting time the output from the microprocessor 1 is sent to the D/A converter 6, whereas at the other time the data from the reducer 41 are applied to the D/A converter 6. FIG. 41 shows an embodiment wherein the control signal MPX SET from the microprocessor 1 becomes high and the input to the D/A converter 6 becomes the maximum value forcibly. Similarly, the control signals MPX SET and MPX REST become low and the input to the D/A converter 6 becomes zero forcibly. Further, when the signal MPX SET is low and the signal MPX RESET is high, the data from the reducer 41 are applied to the D/A converter 6.

As described above, the semiconductor laser (laser diode) 20 is connected to the output current terminals Io of the five voltage/current conversion circuits 9–13 in the wired-OR arrangement. The optical output (laser beam quantity) of this semiconductor laser 20 is detected by the photo-diode 21 as optical output detection means. Various detection methods can be employed for detecting the optical output such as by detecting the back beam of the semiconductor laser 20 by the photo-diode 21 or by dividing part of the outgoing laser beam of the semiconductor laser 20 by a beam splitter and detecting it by the photo-diode 21.

As described above, the output voltage of the photo-diode is converted to the digital value by the A/D converter 8 and is then sent to the microprocessor 1. Incidentally, a resistor R5 is a load resistor connected between the cathode of the photo-diode 21 and the ground and $V_{cc}$ represents a power source voltage.

FIG. 3 shows an example of the circuit constructions of the two voltage/current conversion circuits 11 and 12 shown in FIG. 1.

In FIG. 3, reference numerals 117 and 118 represent operations amplifiers (OP amplifiers); reference numerals 119–121 are transistors; 122 is an open-collector type buffer IC (integrated circuit) as a "not" circuit; and R6–10, 20–23 are resistors.

Here, it will be assumed that the value of each resistor R6–R9 is set to a predetermined value RA, that is, $$R6 = R7 = R8 = R9 = RA$$

and
RA > R10.
Then, the collector current Io1 of the transistor 119 is given as follows with Vi representing the voltage at the input voltage terminal:

$$Io1 \approx Vi/R10$$

Assuming that the input control terminal Di is at a low level, the transistor 120 is ON and a current which is substantially equal to the collector current Io1 described above flows between the collector and emitter of the transistor 120. Assuming that the input control terminal Di is at a high level, the transistor 120 is OFF and a current substantially equal to the collector current Io1 flows between the collector and emitter of the transistor 121 and a current occurs at the output terminal Io.

In this manner, the conversion current corresponding to Io1 ≈ Vi/R10 can be ON/OFF controlled in accordance with the levels of the input control terminal Di, and the circuit shown in FIG. 3 becomes a voltage/current conversion circuit capable of the switching operation in accordance with the levels of the input control terminal Di.

Incidentally, the resistor R20 in FIG. 3 constitutes a current stabilization circuit for stabilizing the current Io1. The resistance values of the resistors R20, R21, R22 and R23 are selected in advance so as to satisfy the following relation:

$$R20 \approx R21 \approx r23$$

$$R22 \times Io1 = 1 \sim 2 \ (V)$$

It will be assumed also that the current amplification degree of the transistors 119–121 and the voltage amplification degree of the operational amplifiers 117, 118 are both extremely great.

Next, the circuit operation of FIG. 1 will be described. The D/A converters 3–5 convert the digital data which are sent from the microprocessor 1 and represent the voltage values to the analog voltages $V_2$–$V_4$, respectively, and the voltages $V_2$ is inputted to the input voltage terminal Vi of the corresponding voltage/current conversion circuit 12. The D/A converter 4 converts the digital data sent from the microprocessor 1 to the analog voltage (bias voltage) $V_3$, and a voltage $V_B$ obtained by summing this voltage $V_3$ and the output voltage $V_1$ is inputted to the input voltage terminal Vi of the voltage/current conversion circuit 11. In this manner, the voltages inputted to the voltage/current conversion circuits 11 and 12 are controlled individually and the output currents of these voltage/current conversion circuits 11 and 12 are set so as to become $I_B$ and $I_W$ respectively.

Since the output terminals Io of the voltage/current conversion circuits 11 and 12 are connected in the OR arrangement as shown in FIG. 1, a current $L_L$ supplied to the semiconductor laser 20 is the sum of each current as given below:

$$L_L = I_W \times S\phi + I_B$$

where $S\phi$ is 0 or 1.

Since the input control terminal Di (hereinafter referred to the "switching terminal") of the voltage/current conversion circuit 12 can make ON/OFF control of the output currents, the current $I_L$ can be given as follows from the afore-mentioned formulas of the current $I_{o1}$ and $I_L$:

$$I_L = S\phi \cdot V2/R10 + V_B/R10$$

Here, $S\phi$ represent the ON/OFF state of the switching terminal Di of the voltage/current conversion circuit 12. When the switching terminal Di is at the high level, $S\phi = 1$ and when the switching terminal Di is at the low level, $S\phi = \phi$, and the current $I_L$ is controlled in accordance with the input pulse signal to the switching terminal Di. A value of a resistance R10 of the voltage/current circuits 11 and 12 determines the maximum current for driving the voltage/current conversion circuits 11 and 12, and accordingly it may be different values for the circuits 11 and 12, respectively.

Figure 10:
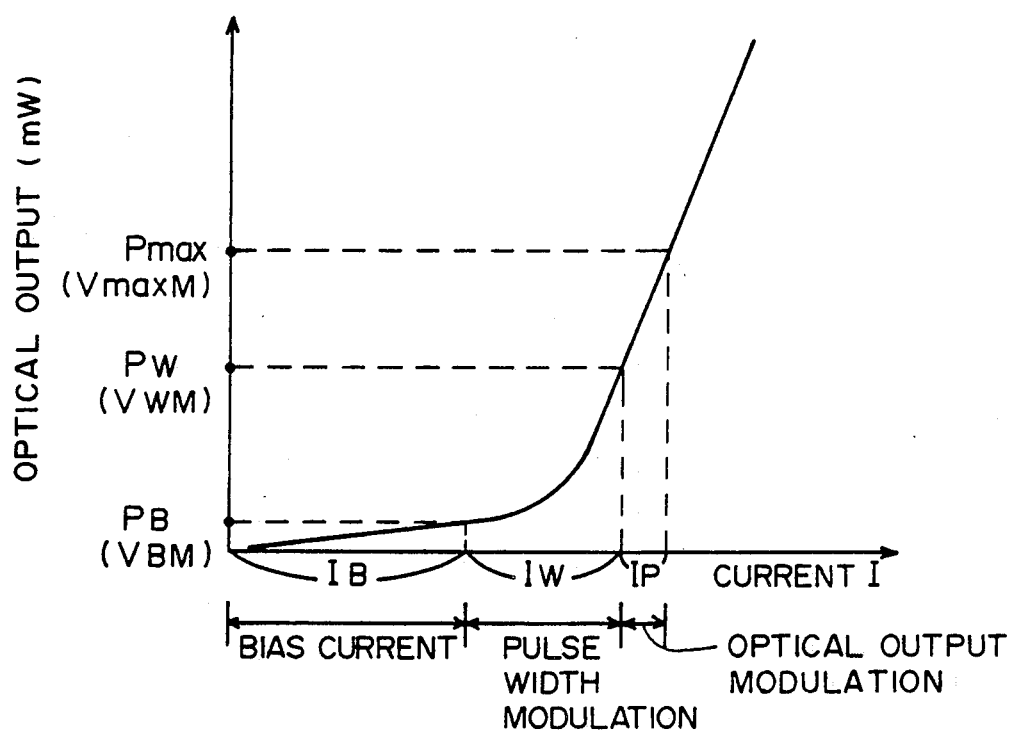
FIG. 10 is a diagram showing the relation between a current and an optical output in said first embodiment.

It will be assumed that the current optical output characteristics of the semiconductor laser 20 in this embodiment are such as those shown in FIG. 10 and the output voltages corresponding to the optical outputs $P_B$, $P_W - P_{max}$ of the photo-diode 21 for monitoring the optical quantity are $V_{BM}$, $V_{WM}$, and $V_{maxM}$, respectively. Therefore, when the output optical quantity of the semiconductor laser 20 is P1, for example, the voltage $V_{BM}$ is outputted from the photo-diode 21.

The data $D\phi - D8$ inputted to the data latch circuit 2 are the image data, $D\phi$ is the least significant bit (LSB) and D8 is the most significant bit (MSB). Laser optical energy adjustment of $256(2^8)$ gradations by the pulse width modulation, totally 288 gradations by the pulse width modulation, 32 gradations by the optical output modulation, totally 288 gradations is made by these 9-bit data.

The input image data $D\phi - D9$ are inputted in synchronism with the rise edge of the pixel clock signal CLK (sync signal). The reason why the input image data are latched by the data latch circuit 2 is to eliminate any deviation of the rise of the input image data $D\phi - D8$ between them. A LON signal outputted from the microprocessor 1 is inputted to the select unit 15 and the switching terminal Di of the voltage/current conversion circuit 12 is at the high level if this LON signal is at the low level.

Specifically, a current is supplied to the semiconductor laser 20 from the voltage/current conversion circuit 12.

Next, the control operation of the microprocessor 1 and the action of this embodiment will be explained with reference to the flowchart of FIG. 2.

First of all, the microprocessor 1 sets the outputs of the D/A converters 3-5 to 0 V before the exposure to the photosensitive material by the laser (print operation) is made or in other words, before the image data are outputted, sets the LON signal to the high level and sets the switching terminal Di of the voltage/current conversion circuit 12 to the low level. Further, the signal MPX RESET is applied to the MPX 45 from the microprocessor 1 so that the output of the MPX 45 becomes zero. As a result, the output of the D/A converter 6 becomes $O_V$, because the input data of the D/A converter 6 becomes zero (step 1). At this time, the input voltages $V_2-V_B$ of the voltage/current conversion circuits 11 and 12 are $V_2=V_B=0$ and consequently, the current $I_L$ flowing through the semiconductor laser 20 is $I_L=0$.

Subsequently, only the output voltage $V_3$ of the D/A converter 4 is raised by a predetermined value (step S2). Simultaneously, the microprocessor 1 monitors the voltage $V_M$ from the photo-diode 21 through the A/D converter 8 (step S3). Here, if the semiconductor laser 20 emits the beam, a current flows through the photo-diode 21 and a positive voltage $V_M$ occurs at the junction between the photo-diode 21 and the resistor R5. Therefore, the microprocessor 1 can determine the laser beam quantity (optical output) of the semiconductor laser 20 by measuring this voltage $V_M$.

While monitoring this voltage $V_M$, the microprocessor 1 gradually raises the output $V_3$ ($=V_B$; $V_1=0$) of the D/A converter 4. Since the Di terminal of the voltage/current conversion circuit 11 is always kept at the high level, a current $I_L = V_3/R10$ flows through the semiconductor laser 20. When the semiconductor laser 20 emits the beam in accordance with the optical output characteristics shown in FIG. 10 and the voltage $V_M$ from the photo-diode 21 detected this optical output reaches a set value $V_{BM}$, the microprocessor 1 stops the rise of the output $V_3$ of the D/A converter 4. Since the set value $V_{BM}$ is the output voltage of the photo-diode 21 corresponding to the optical output $P_B$ in FIG. 10, the semiconductor laser 20 generates the optical output $P_B$. The current $I_L$ flowing through the semiconductor laser 20 at this state corresponds to the bias current $I_B$ shown in FIG. 10.

Next, the microprocessor 1 sets the LON signal to the low level under the state where the voltage $V_B$ is kept at a value corresponding to the optical output $P_B$ and is supplied to the semiconductor laser 20 (step S4). At this time, a high level signal is supplied from the select portion 15 to the Di terminal of the voltage/current conversion circuit 12 ($S\phi$ becomes 1) and the current can flow through the output terminal Io of the voltage/current conversion circuit 12. The current $I_L$ flowing through the semiconductor laser 20 is given by the following formula:

$$I_L = V2/R10 + I_B$$

(where $I_B = V_B/R10$)

Next, the microprocessor 1 monitors the voltage $V_M$ outputted from the photo-diode 21 through the A/D converter 8 and gradually raises the output voltage $V_2$ of the D/A converter 5 until this voltage $V_M$ reaches the predetermined value $V_{WM}$ (the value corresponding to the optical output $P_W$: steps S5 and S6). When the voltage $V_M$ reaches the predetermined value $V_{WM}$, the predetermined value $V_{1M}$ is obtained by the sum of the voltage $V_3$ corresponding to the optical output $P_B$ outputted from the D/A converter 4 and the voltage $V_2$ outputted from the D/A converter 5. In other words, the optical output $P_B$ (current $I_B$) is controlled by the D/A converter 4 and the output $P_W - P_B$ (current $I_W$) is controlled by the D/A converter 5.

Similarly, while the voltages $V_3$, $V_2$ outputted from the D/A converters 4, 5 are kept at a constant value obtained up to the step 6, the input data to the D/A converter 6 are set to data similar to that when the maximum image data are inputted (the output of the MPX 45 is set to the maximum image data by applying the signal MPX SET to the MPX 45 from the microprocessor 1). The microprocessor 1 raises gradually the output voltage $V_2$ of the D/A converter 5 and when the voltage $V_M$ reaches a predetermined value $V_{maxM}$ corresponding to the optical output $P_{MAX}$, it stops the rise of the output voltage $V_4$ to determine the output voltage $V_4$ of the D/A converter 3 (steps S7, S8 and S9).

As described above, since the output voltages of the D/A converters 3-5 are set to the values providing the predetermined optical outputs $P_B$, $P_W$, $P_{max}$ (see FIG. 10) of the semiconductor laser 20, the optical output which is always stable can be obtained by preventing the changes of the optical output due to the temperature change of the semiconductor laser 20 and to the variance of its characteristics. In other words, though the voltage value (current value) necessary for obtaining a predetermined optical output can be set in advance, the desired optical output cannot be obtained from time to time at the initially set voltage if there are any temperature changes or the variance of characteristics. Therefore, the voltage value providing the actual desired optical output is determined by monitoring the actual optical output of the semiconductor laser 20 by the photo-diode 21.

Next, the microprocessor 1 sets the LON signal to the high level and the MPX to the reducer 41 (step S10) and starts the image data read operation and the print operation (step S11). At this time the input image data $D\phi$–D8 pass through the data latch circuit 2 as the current control means, the generator unit 16, the cancel unit 17 and the select unit 15 and are converted to the exposure energy (irradiating energy) of 288 steps. This embodiment employs the structure of obtaining 256 ($2^8$) steps by pulse width modulation and in the remaining 32 steps kept by the current value (optical output). The exposure energy is adjusted by the current control. Thus, in total, the gradation of 288 steps can be obtained.

Among the input data $D\phi$–D8, the lower order 8 bits $D\phi$–D7 are used for pulse width discrimination and the gradation corresponding to the input image data is obtained based on the pulse modulation until the input image data over 256. If the image data over 256 is applied, the bias current is increased as described later.

Next, the generator unit 16 will be explained in detail.

The generator unit 16 has the function of dividing roughly the pixel clock signal CLK (sync signal) by 16 and generates 16 pulse widths on the basis of the upper order 4 bits D4–D7 among the lower order 8 bits for pulse widths discrimination.

Figure 11:
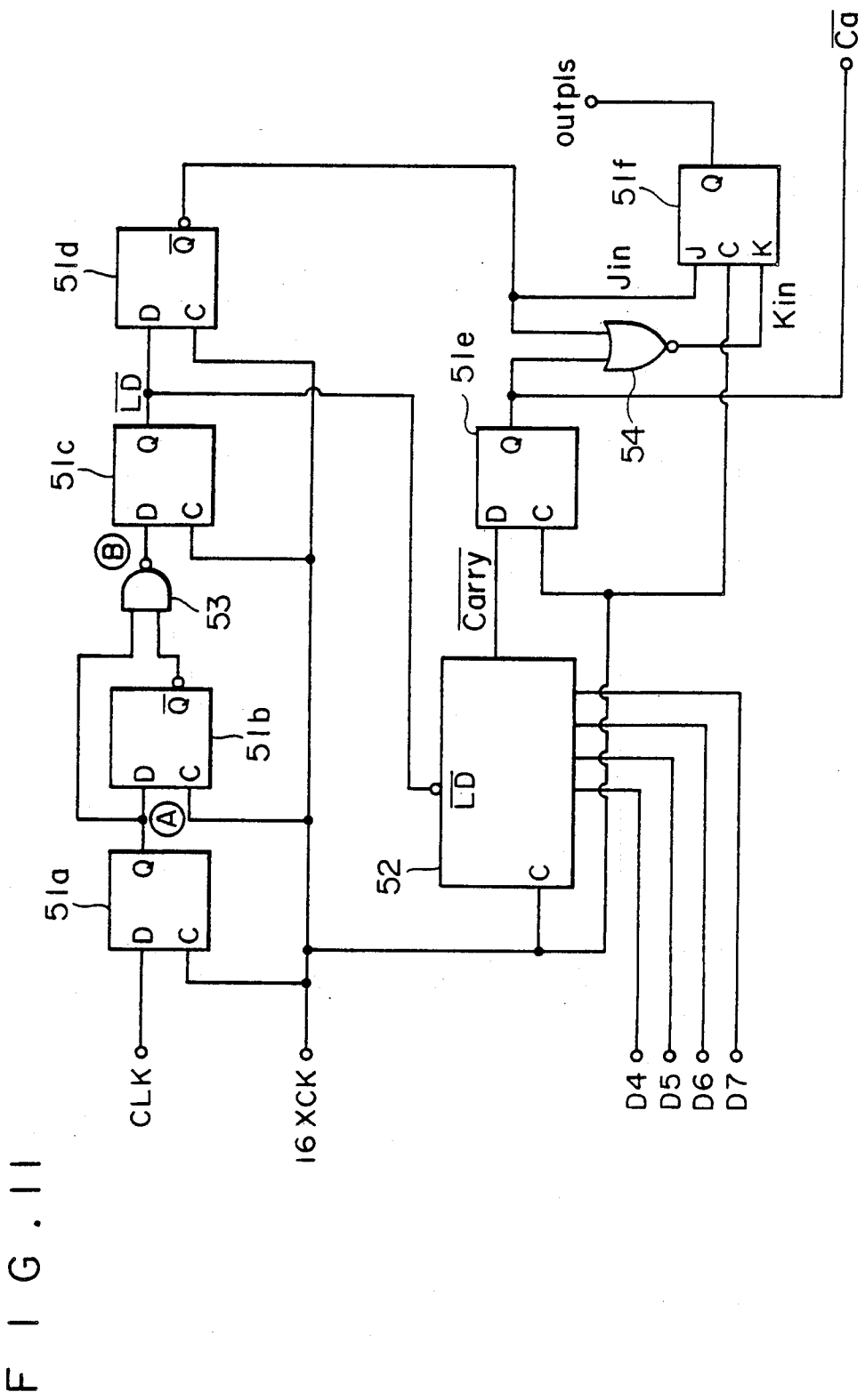
FIG. 11 is a circuit diagram showing a generator unit shown in FIG. 1.

FIG. 11 shows an example of the circuit of this generator unit 16. The generator unit 16 consists of flip-flop circuit 51*l*–51*f*, a 4-bit binary down-counter 52, a NAND circuit 53 and a NOR circuit 54.

Figure 12:
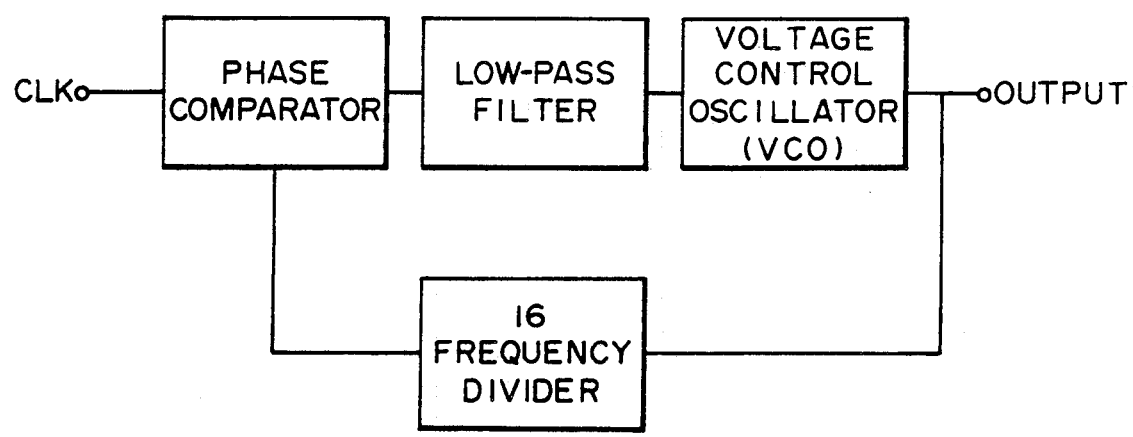
FIG. 12 is a block diagram showing an example of a PLL circuit that can be used in the embodiment described above.

A clock 16×CK which is 16 times the pixel clock CLK is used in order to divide the pixel clock signal CLK by 16. If a 1/16 frequency divider (not shown) is used as sync signal generation means for generating the pixel clock CLK (sync signal) for example, a clock (high frequency signal) 16 times the pixel clock is naturally necessary and the clock 16×CK described above can be used. If only the pixel clock CLK exists, however, the clock 16×CK can be generated easily by use of PLL (phase Locked Loop) such as shown in FIG. 12. Alternatively, if the sync relation (phase) between the pixel clock CLK and 16×CK is neglected, it is possible to use merely a quartz oscillator which generates a clock 16 times the pixel clock CLK.

Figure 13:
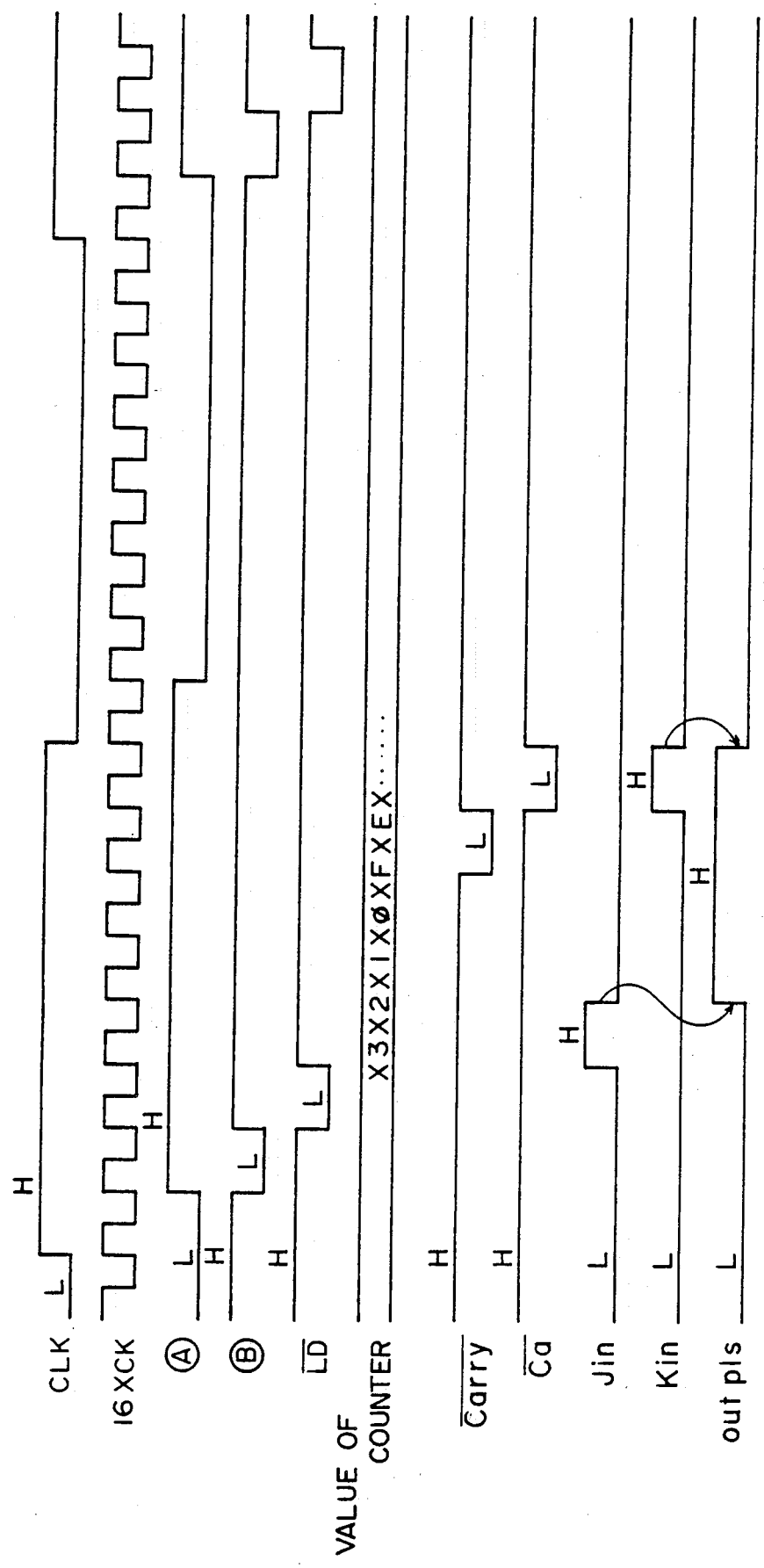
FIG. 13 is a time chart showing the control characteristics of a generator unit shown in FIG. 11.

As shown in FIG. 11, the generator unit 16 loads the image input data D4–D7 to the 4-bit binary down-counter 52, inputs the carry after down-count to the flip-flop 51*e* and generates a rise control signal Jin for a division pulse out pls by the combination of the flip-flop circuits 51*a*–51*d* and the NAND circuit 53, and a fall control signal Kin of the division pulse out pls by the "not" logical sum of the output of the flip-flop 51*e* and the rise control signal Jin, as shown in FIG. 13.

The generator unit 16 can obtain the 16-step pulse widths corresponding to the values $\phi$–15 of the image input data D4–D7 such as shown in FIG. 14 and when "D7, D6, D5, D4" is "0, 1, 1, 1", for example a division pulse out pls having a ½ pulse width of the pixel clock CLK is outputted. Here, the minimum pulse width after division is 1/16 CLK and the pulse width increases by 1/16 CLK to the maximum pulse width of CLK (16/16 CLK). Incidentally, the pulse width division in the generator unit 16 is not obviously limited to division by 16.

Next, the cancel unit 17 as the second pulse width fine division control means will be explained in detail.

Figure 15:
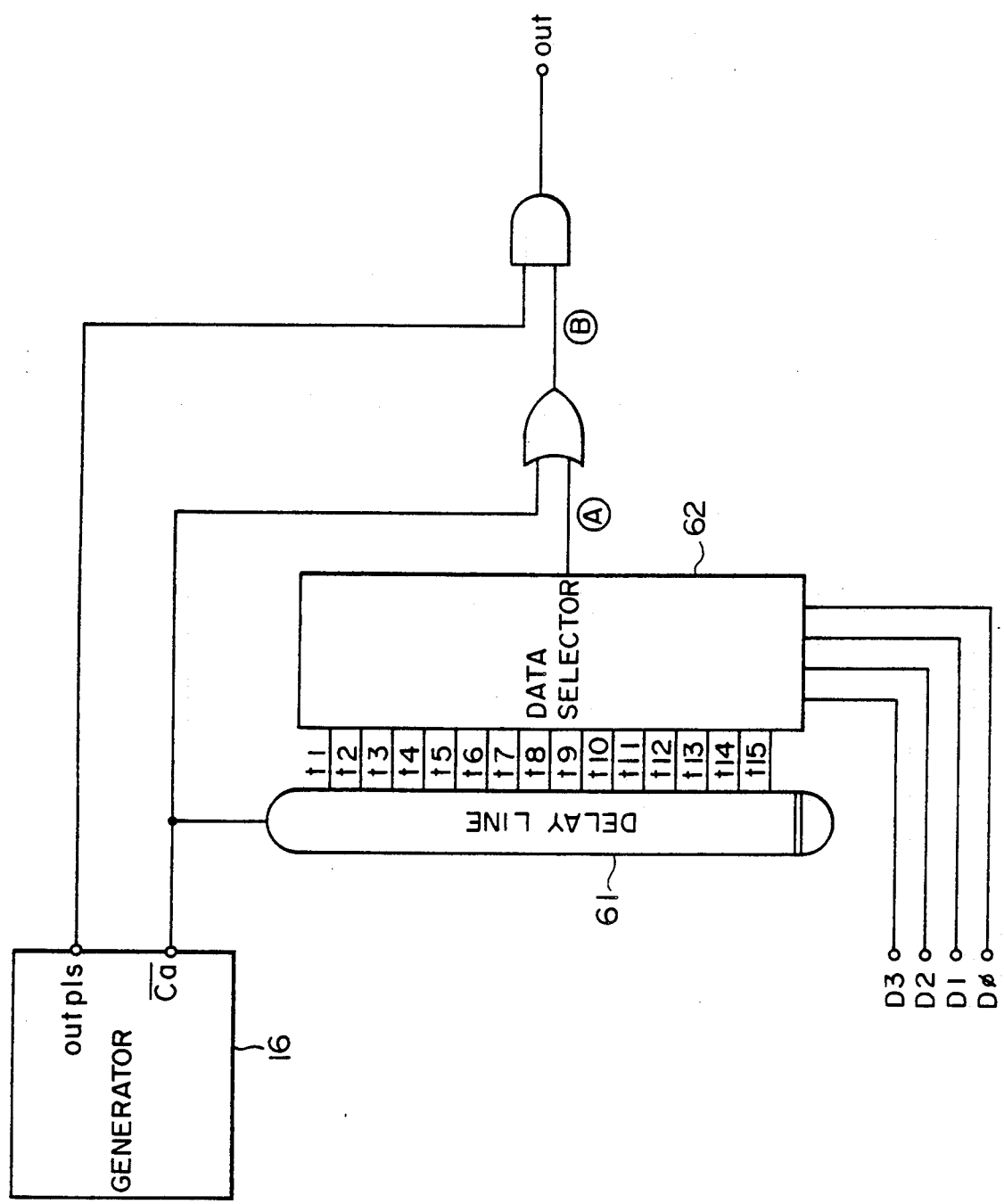
FIG. 15 is a circuit diagram showing an example of a circuit of a cancel unit shown in FIG. 1.
Figure 20A:
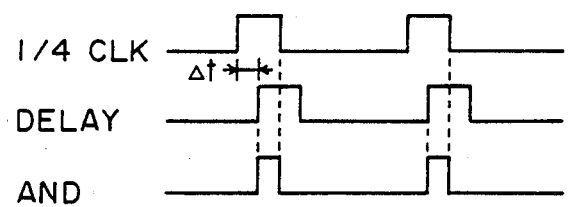
FIGS. 20(a)-20(d) are time charts useful for explaining the problems in a pulse divider as a comparative example for the embodiment of the invention, respectively.
Figure 20B:
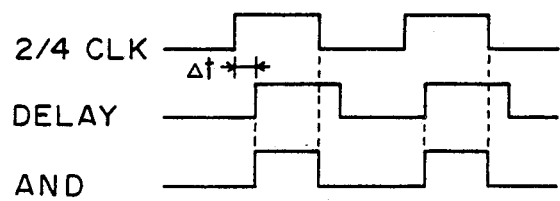
Figure 20C:
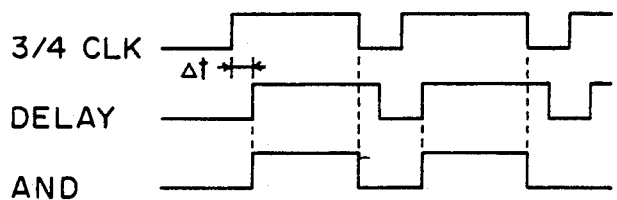
Figure 20D:
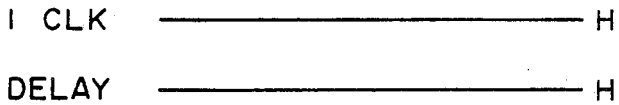

FIG. 15 shows a circuit example of the cancel unit 17. The 16-step division pulse out pls which is generated by the generator unit 16 and whose minimum is 1/16 CLK is corrected with accuracy of 1/16 of the pulse width of 1/16 of the pixel clock CLK by use of a delay line 61 so as to increase the number of steps of the pulse width modulation to 16×16=256 steps. Thus, a delay time between adjacent taps of the delay line 61 becomes 1/16×1/16 CLK=1/256 CLK.

The delay line 61 delays a $\overline{Ca}$ pulse (high frequency signal) having a pulse width of 1/16 of the pixel clock signal CLK and being generated separately from the division pulse out pls (fundamental pulse width) form the generator 16 in 15 ways (t1–t15) as shown in FIG. 16 and one of delay pulses t2–t15 is selected by a data selector 62 in accordance with the input image data $D\phi$–D3 and finally corrects the division pulse out pls generated by the generator unit 16 with accuracy of 1/16 of the pulse width of 1/16 of the pixel clock CLK as shown in FIG. 17. In other words, it cancels (erases) the input out pls with accuracy of CLK/256. In the example of FIG. 16, D3–D$\phi$ are inputted and t3 is selected by the data selector 62.

In other words, the cancel unit 17 calculates the logical sum B between the delay pulse A selected in accordance with the image data $D\phi$–D3 and the $\overline{Ca}$ pulse and calculates the logical product of this logical sum B and the out pls from the generator unit 16 so as to cut out pls with accuracy of CLK/256 and to further divide it. When "D7–D4" is "1, 1, 1, 1", the latter half of the delay pulse A is positioned by the delay before the leading end of the next pixel region and accordingly if the out pls is cancelled without logical summing the leading end portion of the next pixel would be cancelled. This results in the pulse width of the next pixel becoming shorter than the setting value. This is the reason why the logical sum of the delay pulse A and the $\overline{Ca}$ pulse is obtained.

In accordance with methods other than the method described above calculating the logical sum OR or the logical product AND between the delay line output and the pixel clock CLK or the fundamental pulse width signal (out pls: Japanese Patent Laid-Open Nos. 152373/1981, 296558/1988), the fundamental pulse always needs the rise or fall edge so that fine division by use of the delay line cannot be made at the minimum pulse width or maximum pulse width and the jump of the pulse width divided at that portion occurs and invites the drop of image quality, as shown in FIGS. 18 and 19.

When, for example, the image input data D4–D7 at the 16-division step in the generator unit 16 are "1, 1, 1, 1" as in this embodiment, the continuous high level signal is outputted for one pixel clock (see FIG. 14) so that the edge of the pulse width does not exist. Accordingly, the delay of the pulse cannot be made by the method which calculates OR or AND between the delay line output and the pixel clock CLK or the fundamental pulse width signal, and further division cannot be made when D4–D7 are "1, 1, 1, 1".

In other words, further division can be made by the tap number of the delay line if the image input data D4–D7 exist from "$\phi, \phi, \phi, \phi$" to "1, 1, 1, $\phi$" and the rise or fall of the pulse exists in one pixel clock CLK, but when they are "1, 1, 1, 1", further division described above cannot be made so that the jump occurs in the change of the pulse width.

Assuming that the low level is outputted during one pixel clock CLK when D4–D7 are "$\phi, \phi, \phi, \phi$", on the contrary, the pulse becomes a high level pulse for the period of 15/16 CLK when D4–D7 are "1, 1, 1, 1" and the pulse width can be further divided by use of the edge of 15/16. At this time, however, no pulse exists (or no edges exists) during one pixel clock CLK when D4–D7 are "$\phi, \phi, \phi, \phi$" and further division becomes impossible. In this case, therefore, division can be made by use of the delay line between "$\phi, \phi, \phi$, 1" and "1, 1, 1, 1" but cannot in the case of "$\phi, \phi, \phi, \phi$" so that the jump of the pulse width modulation takes place, too.

The example of the former is shown in FIGS. 20(a)–20(d). Here, fundamental pulse widths (corresponding to out pls outputted from the generator 16) are four kinds (¼ CLK, 2/4 CLK, ¾ CLK and 1 CLK) to simplify the explanation.

Figure 21:
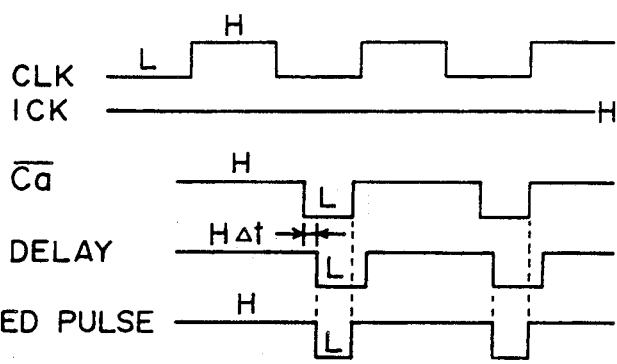
FIG. 21 is a time chart showing pulse division characteristics in the first embodiment of the invention.

In the case of the system which divides finely the pulse width as in this embodiment, the problem described above is solved by not delaying the fundamental pulse width (fine division pulse out pls in the generator unit 16) but delaying the pulse width for the period of time (1/16 CLK in this embodiment) corresponding to minimum resolution of the fundamental pulse width). Namely, as shown in FIG. 21, even when D4–D7 are all 1 and the division pulses out pls outputted from the generator unit 16 are the continuous high level pulses, the pulse width can be finely divided by the tap number of the delay line by calculating the logical sum OR between the pulse signal $\overline{Ca}$ outputted simultaneously from the generator unit 16 and the delay pulse.

In this embodiment, the fundamental pulse width out pls is cut (erased) by calculating the logical product AND between the delay pulse B shown in FIG. 15 and the fundamental pulse width out pls. As is obvious from the foregoing description, however, the pulse width may be increased by calculating OR (logical sum) between the delay pulse B and the fundamental pulse width out pls as shown in FIG. 23 by use of the hardware construction shown in FIG. 22. In this case, the output pulse out pls of the generator unit 16 is the low level for one pixel clock CLK period when D4–D7 are "$\phi, \phi, \phi, \phi$", contrary to the case shown in FIG. 14, and this case can be applied to the case of 15/16 CLK when the image input data are "1, 1, 1, 1".

In the embodiment described above, the pulse width is changed by increasing or decreasing the rear edge (fall) of the fundamental pulse width out pls but the similar procedure can be obviously employed for the front edge (rise).

The foregoing explains that the pulse width out pls divided by 16 in the generator unit 16 is further divided by 16 by the cancel unit 17 and the pulse width modulation of the 256 steps is effected. Next, the select unit 15 will be explained. The select unit 15 will be explained. In the select unit 15, the pulse width modulation signal from the cancel unit 17 is outputted as $S\phi$ when the input image data correspond to the pulse width modulation region, and the semiconductor laser 20 is pulse width modulated by the optical output $P_W$ through the voltage/current conversion circuit 12. If image data, from which a required exposure energy cannot be obtained even if the pulse width is increased to the maximum pulse width are applied, the output of the decoder 42 becomes high level, and during one pixel time $S\phi$ becomes high level, so that the voltage/current conversion circuit 12 serves to flow the current $I_W$ to the semiconductor laser 20 for the time of the maximum pulse (1 pixel time).

Further, data obtained by subtracting the input image data from the setting value (an input image data corresponding to the switch timing between the pulse width modulation and the optical output modulation) are applied to the D/A converter 6 through MPX 45. Accordingly, the bias current $I_B$ is increased or decreased according to the input image data. In this state, $I_W$ is always kept ON and thus the optical output is varied between $P_W$ and $P_{max}$ according to the input image data as shown in FIG. 9.

When the optical output is controlled as stated above, the exposure time is fixed to one pixel time. In the above example, the bias current $I_B$ is always applied to the semiconductor laser 20. However, it may be accepted that the bias current $I_B$ is eliminated and absorbed into the current $I_W$ at the time of pulse width modulation. In other words, $I_B + I_W$ shown in FIG. 10 is used as a new $I_W$ and supplied to the semiconductor laser 20 from the voltage/current conversion circuit 12. At the optical output modulation, the sum of the currents from the voltage/current conversion circuits 11 and 12 is supplied to the semiconductor laser 20.

According to said first embodiment, a final gradation number is determined by the sum of the gradation due to the pulse width modulation and the gradation due to the optical output modulation, so that it is not necessary to use fine control unit of the pulse width or the optical output compared with the case that the same gradation number is obtained from the gradation of one of the two. Further, the simplicity of density or individuality can be maintained, because the optical output modulation is carried out in the range larger than an optical output which is maintained at a constant value when the pulse width modulation is carried out.

Figure 26:
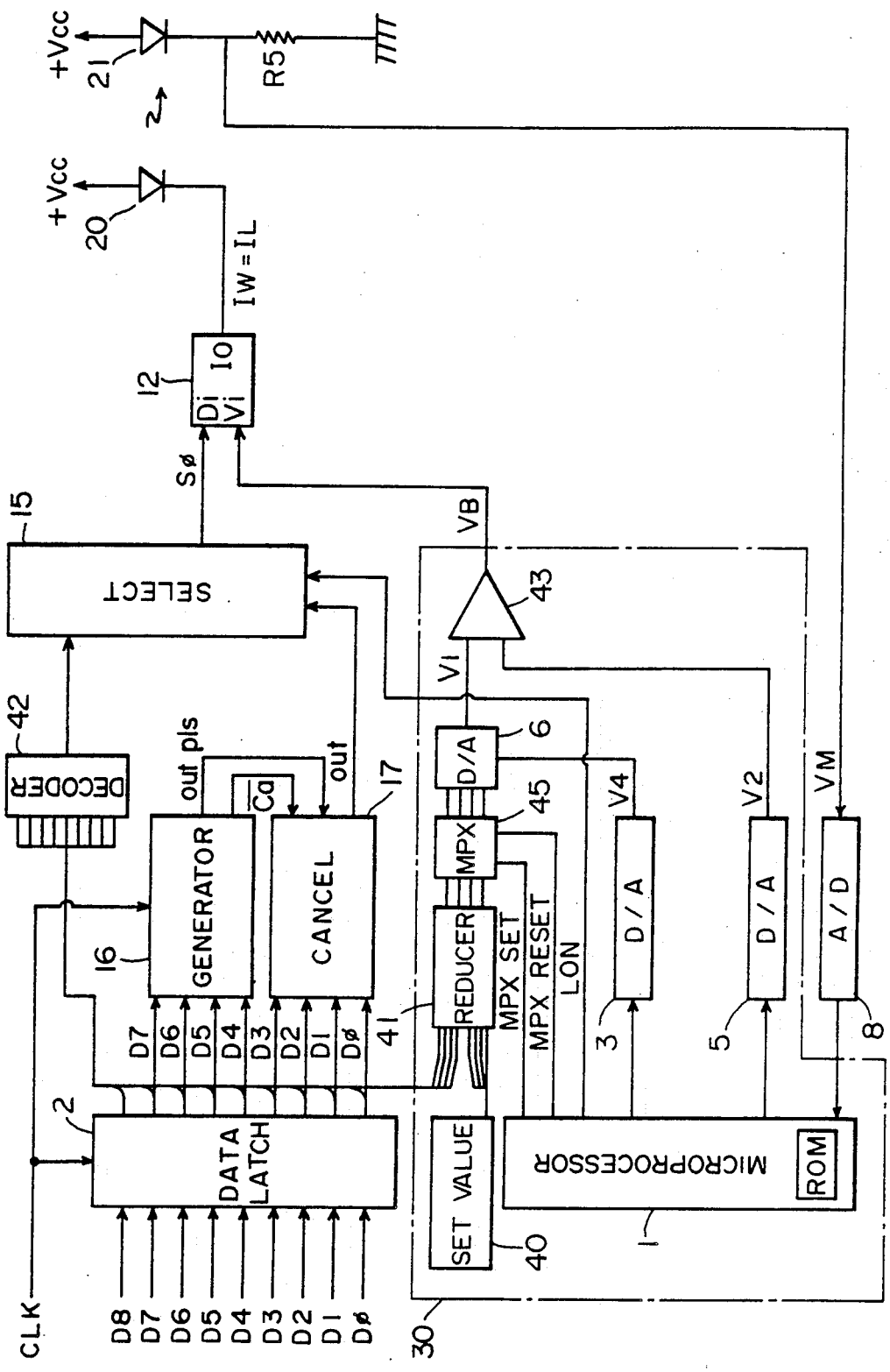
FIG. 26 is a circuit diagram showing a second embodiment of the semiconductor laser driving apparatus of the present invention.

In said first embodiment, as shown in FIG. 1, the voltage/current conversion circuit 11 for the bias current is provided additionally. However, in case of the bias current of zero, the voltage/current conversion circuits 11 and 12 can be combined or only the voltage/current conversion circuit 12 can be used in the second embodiment as shown in FIG. 26. Further, in FIG. 26, parts similar to those in FIG. 1 have similar reference characters.

In the circuit structure shown in FIG. 26, the voltage/current conversion circuit 11 and the D/A converter 4 for the bias current shown in FIG. 1 are omitted, but the optical output voltage $V_2$ of the D/A converter 5 for the optical output control is applied to the adder 43 instead of the output voltage $V_3$ of the D/A converter 4, whereas the output voltage $V_B$ of the adder 43 is applied to the terminal Vi of the voltage/current conversion circuit 12.

Figure 27:
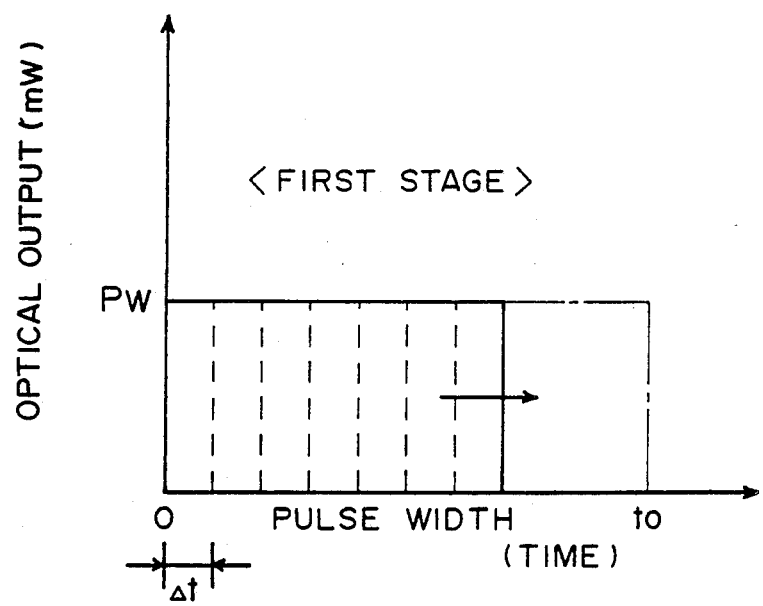
FIGS. 27 and 28 are diagrams explaining control characteristics in the second embodiment.
Figure 28:
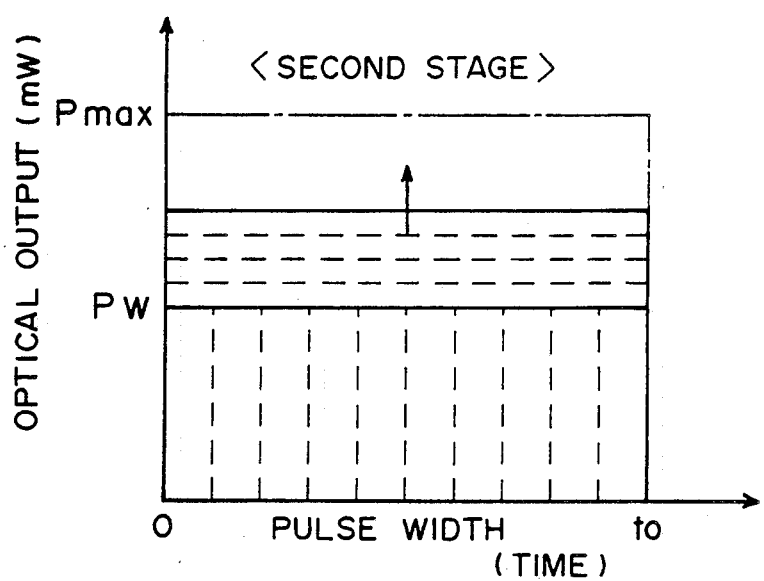

By such construction, in the input image data region (first stage), where the gradation is obtained by the pulse width modulation, the pulse width modulation signal is applied from the selected unit 15 to the input control terminal Di of the current conversion circuit 12 and the optical output is fixed to $P_W$ by the D/A converter 5, as shown in FIG. 27, so that the pulse width (irradiating time=exposure time) modulation is effected according to the input image data while maintaining said constant optical output $P_W$. Further, as the second stage, the optical output of the semiconductor laser 20 is increased or decreased between $P_W$ and $P_{max}$ through the D/A converter 6 as shown in FIG. 28, in case that the exposure energy (density) corresponding to the input image data cannot be obtained even if the laser is irradiated during one pixel clock with said optical output.

Figure 29:
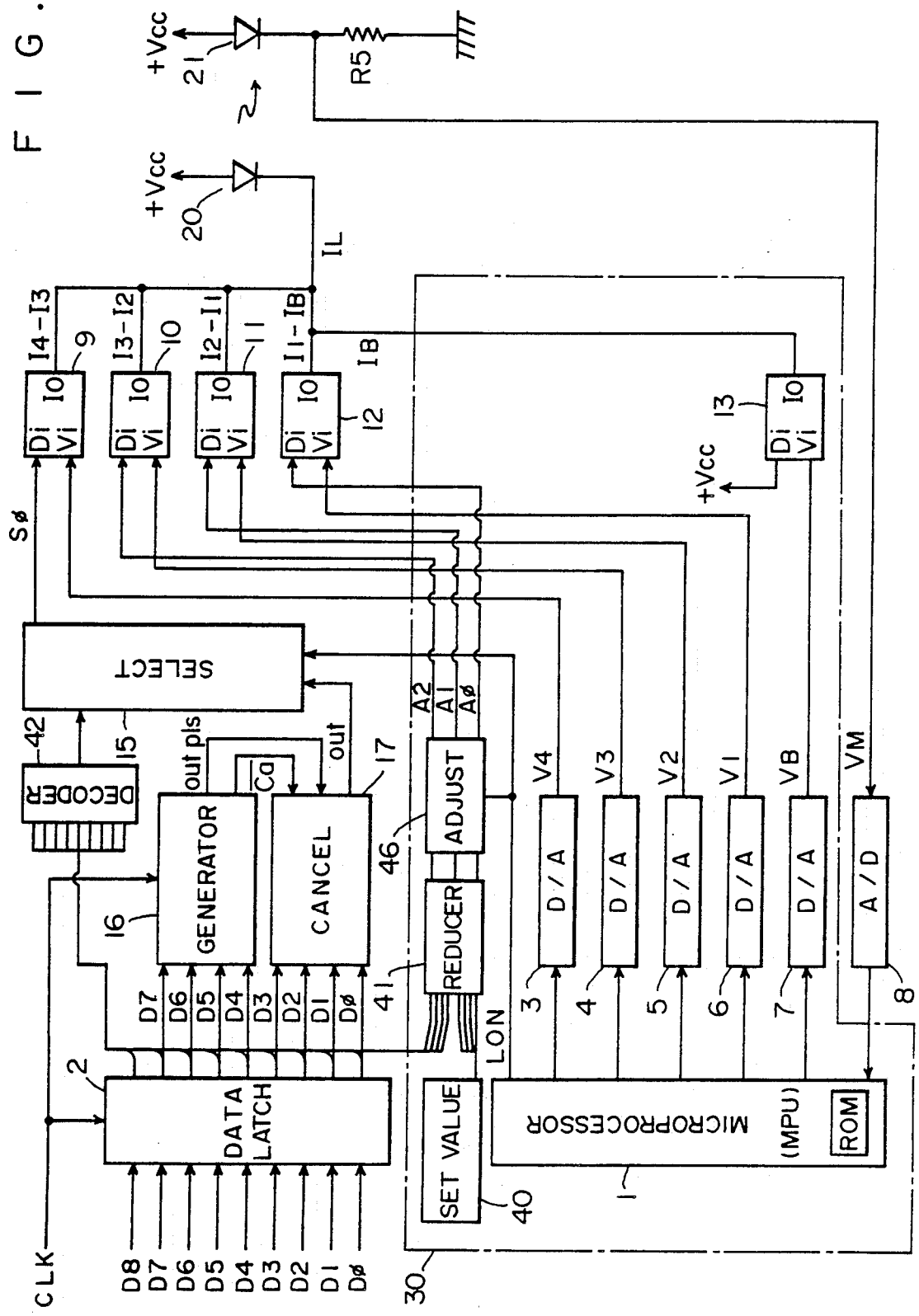
FIG. 29 is a circuit diagram showing a third embodiment of the present invention.

Further, if the optical output is varied linearly with respect to the current variation in the optical output modulation region shown in FIG. 10, the optical output modulation may be effected by using a plurality of voltage/current conversion circuits combined one another on the basis of predetermined weighting, as described in Japanese Laid-Open No. 184773/1988. Specifically, in the third embodiment a plurality of (N) voltage/current conversion circuits weighted are used and the optical output modulations of $2^N$ ways, which are obtained by combining these voltage/current conversion circuits are carried out in the second stage after the pulse width modulation. A circuit structure of such third embodiment is shown in FIG. 29. In FIG. 29, elements which are similar to those in FIG. 1 are designated by the same reference characters.

In the circuit structure shown in FIG. 29, the pulse width modulation is carried out by applying the pulse width modulation signal $S\phi$ from the select unit 15 to the voltage/current conversion circuit 9. The optical output modulating portion of the second stage in the second embodiment is different from that in the first embodiment shown in FIG. 1, and the optical outputs of $2^3 = 8$ ways can be obtained by each of the voltage/current conversion circuits 10-12.

Specifically, though the pulse width modulation in the first stage is the same with that in the first embodiment, in the optical output modulation in the second stage a value obtained by subtracting from the input image data a value of the image data (memorized in the set value 40) corresponding to the turning point between the first and second stages is applied to each of the voltage/current conversion circuit 10-12. Further, the subtract results $A\phi$ and $A2$ applied to the voltage/current conversion circuits 10 and 12 are LSB and MSB, respectively.

In the third embodiment as shown in FIG. 29, the image data corresponding to the turning point memorized in said set value 40 are such that the maximum input value is $255 + 2^3 - 1 = 262$ at FFH. For example, if the input image data is 260, $A\phi - A2$ to be outputted are "1, 0, 1"=5=260-255, as shown in FIG. 30.

Figures 30, 31:
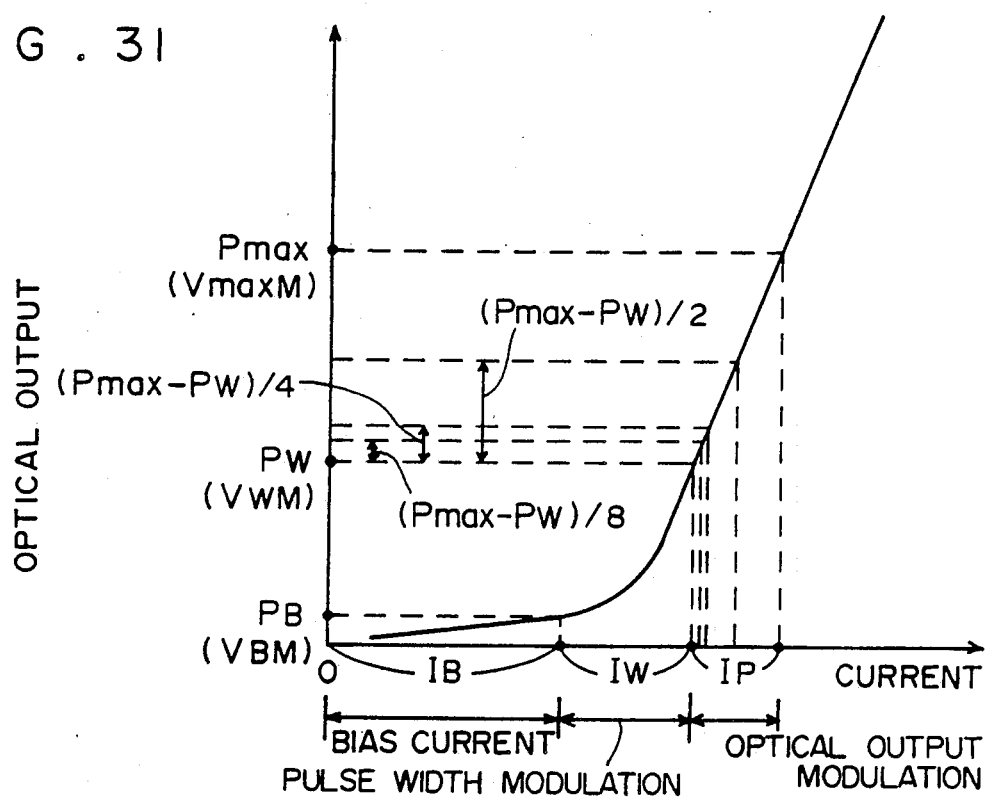
FIG. 30 is a table showing the relation between input data and an optical output value in the third embodiment.
FIG. 31 is diagram showing the relation between a current and the optical output compared with that shown in FIG. 30.

In the characteristics of the semiconductor laser 20 as shown in FIG. 31, for example, if $P_B$ is a bias optical output, $P_W - P_B$ is a constant optical output at the pulse width modulation, and $P_{max} - P_W$ is an optical output modulation region, the optical output modulation is carried out by three voltage/current conversion circuits 10-12. I f the voltage/current conversion circuits 11-12 can be applied to the semiconductor laser 20 current for generating optical outputs of $(P_{max} - P_W)2$, $(P_{max} - P_W)4$ and $(P_{max} - P_W)/8$, respectively, the relation between the input image data and the optical output is shown in FIG. 30.

An adjust circuit 46 in FIG. 29 is used for actuating forcibly the semiconductor laser 20 when each of the D/A converter 3-6 is set initially by the microprocessor 1 and has a circuit structure as shown in FIG. 32.

Figure 33:
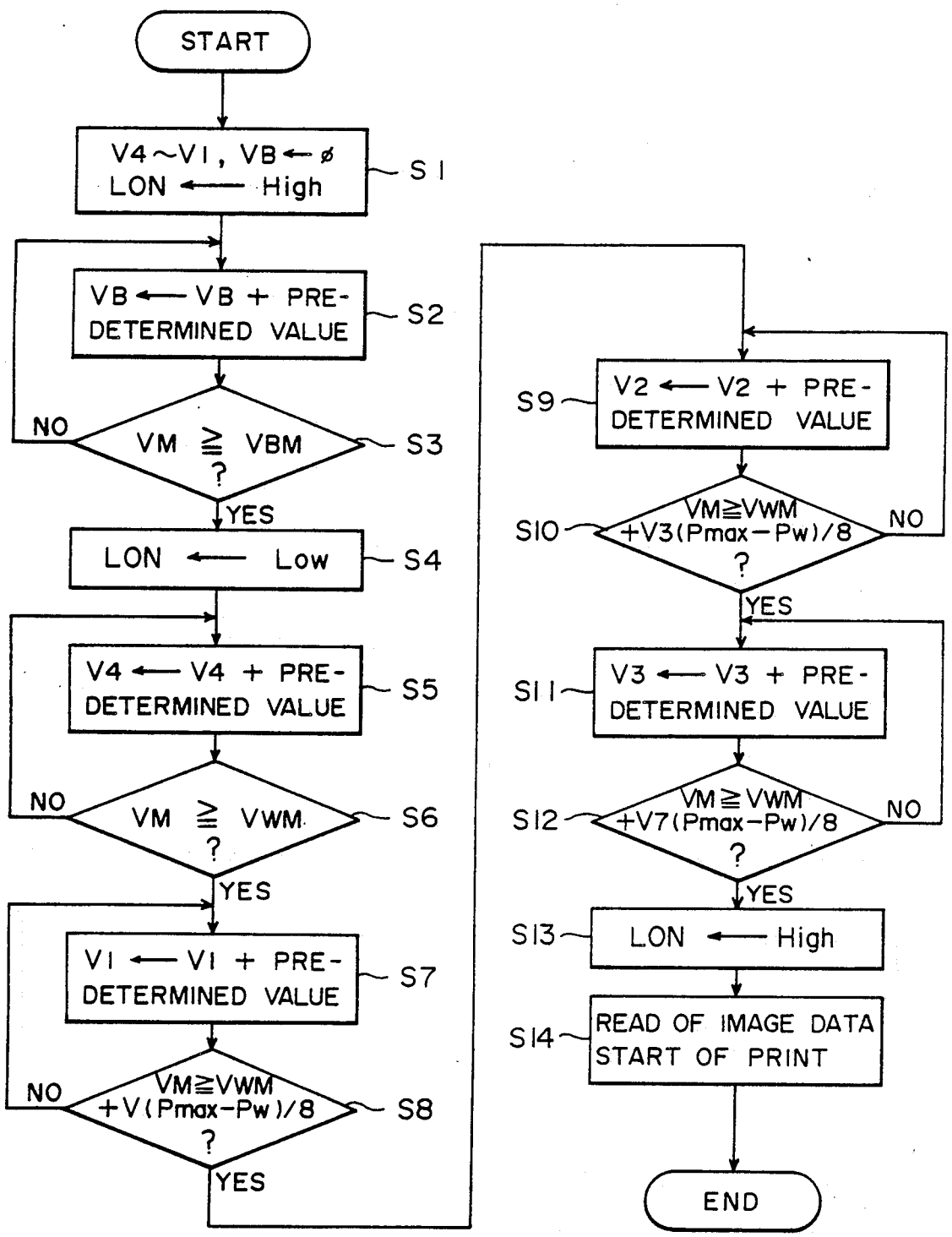
FIG. 33 is a flow chart showing control contents in the third embodiment.
Figure 37:
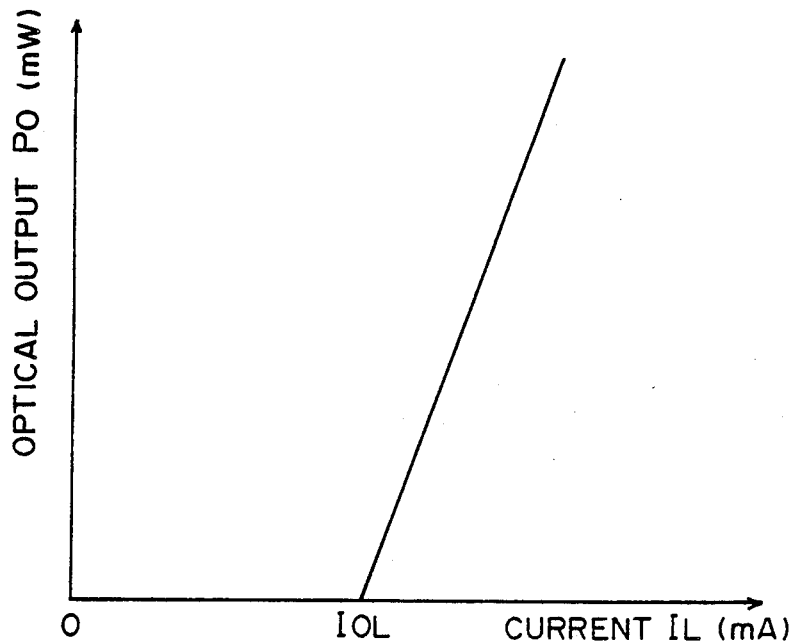
FIG. 37 is characteristic diagram of a semiconductor laser corresponding to a conventional driving apparatus.
Figure 38:
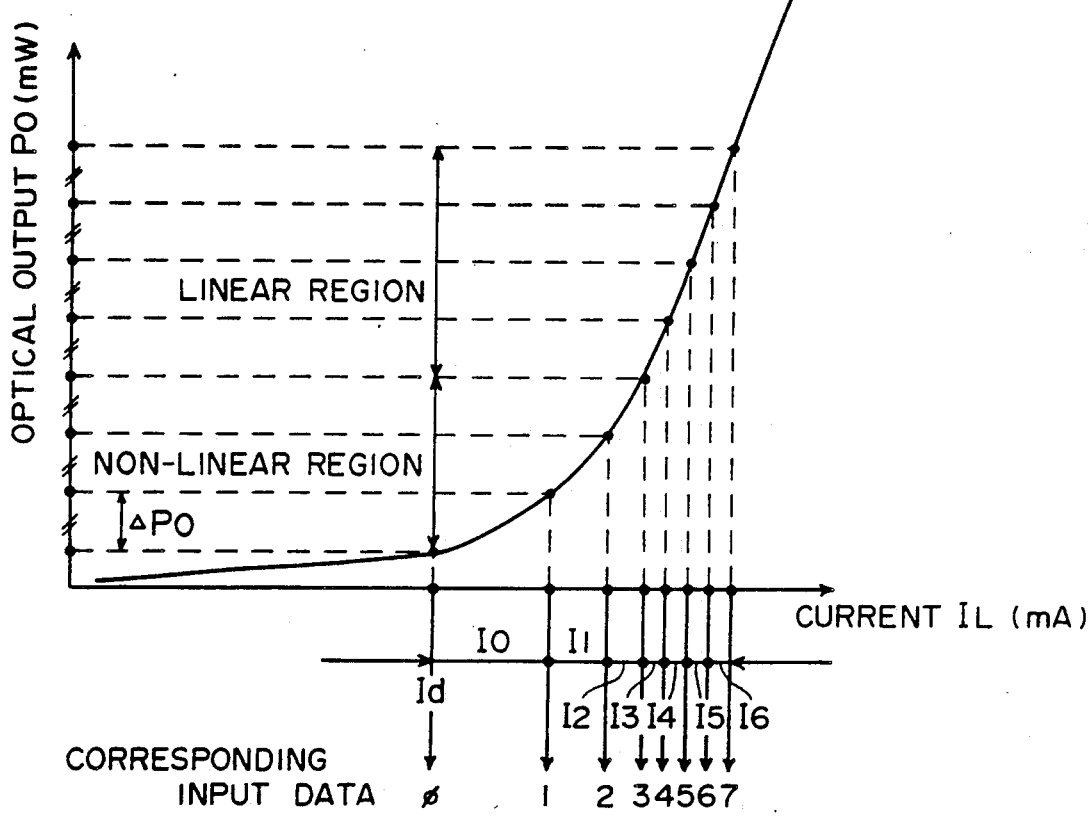
FIG. 38 is a diagram showing characteristics of linear·non-linear regions of the semiconductor laser.
Figure 39:
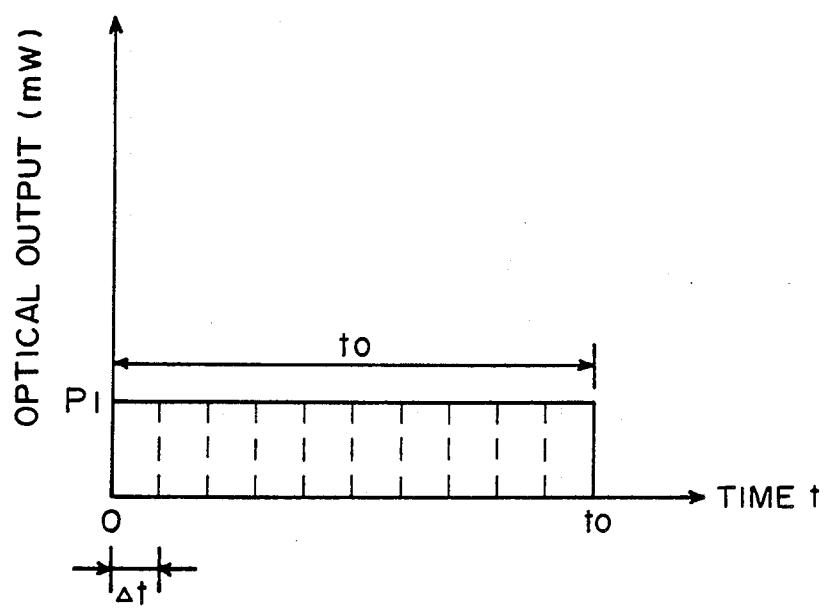
FIGS. 39 and 40 are diagrams explaining the conventional apparatus wherein the irradiating time control and the optical output control are carried out together.
Figure 40:
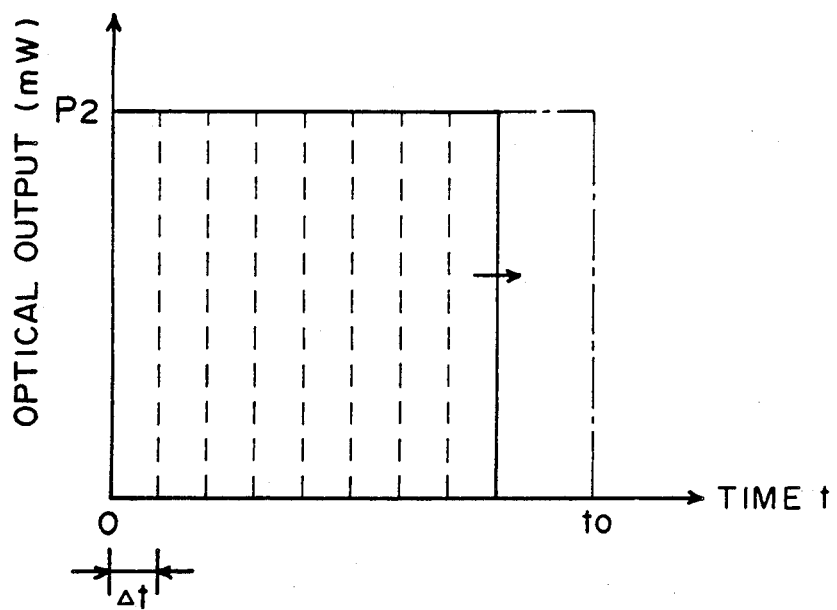

A flowchart in FIG. 33 shows an initial setting program of said D/A converters 3-6. The flowchart in FIG. 33 is similar basically to that in FIG. 2, however, the process steps are increased in proportion to the increment of the number of the D/A converters to be set. In the program shown in the flowchart of FIG. 33, $V_{7(pmax-pw)/8}$ in $V_{WM} + V_{7(pmax-pw)/8}$ which is compared with the voltage $V_M$ in $S_{12}$, for example, shows a voltage corresponding to the optical output $(P_{max} - P_W)$.

In case that the region for modulating the optical output is not a linear region of the semiconductor laser 20 as shown in FIG. 34, a required gradation cannot be obtained by the optical output modulation of current increasing type. In such case, accordingly, a decay means for reducing the light quantity is inserted in the light path to reduce the efficiency of the optical system so that the optical output control range is widened entirely and the optical output modulation is effected in the linear region.

In case that the region initially set in the using region is the non-linear region as shown in FIG. 34, in order to move the modulation turning point of the optical output $P_W = 0.1$ mW to the linear region of 0.5 mW or more, a decay means (filter) having a permeability of $0.1/0.5 = 20\%$ or less is inserted in the light path to maintain the exposure energy similar to that in case that no decay means is inserted. By this arrangement, the optical modulation can be carried out in the linear region of the semiconductor laser 20 to obtain a required gradation.

According to the embodiments of the present invention, the irradiating energy (gradation) of the semiconductor laser 20 is adjusted multi-stepwise by the irradiating time (supply current pulses) modulation and the optical output modulation to obtain a final adjusting step as the sum of said modulations. Thus, no high precision D/A converters etc. are required and accordingly the cost of parts can be reduced compared with the case that the irradiating energy is adjusted by only the optical output control. Further, it is not necessary to set the fine unit adjust time as in the case that the irradiating energy is adjusted by only the irradiating time modulation. Furthermore, in the above embodiments, the optical output is kept constant when the irradiating time is controlled, whereas the optical output is increased more than said constant optical output when the optical output is controlled, so that the individuality (simplicity of density) of each irradiating energy control is maintained and the faithful reproduction can be carried out by the laser printer.

Another embodiment will be explained.

As explained in the first embodiment, it can be understood that sufficient gradation cannot be obtained by merely pulse-modulating a single optical output or the maximum density $D_{max}$ cannot be obtained.

In the above first embodiment, the pulse width control is carried out under a constant optical output as the first stage (pulse width control) to increase the unit pulse width until it reaches the maximum pulse width according to the increase of the required density. In case of image data from which a required density cannot be obtained even if a constant optical output with the maximum pulse width is applied, the optical output is increased stepwise under to state of the maximum pulse width as the second stage (optical output control) to obtain the maximum density.

As will be described later, therefore, the semiconductor laser driving apparatus in a second embodiment of the present invention uses a plurality of optical outputs (laser beam quantities) and increases progressively the pulse width (exposure time) in one pixel clock from lower optical output side.

More definitely, as shown in FIG. 45, the fundamental optical outputs ar four kinds, i.e. $P_1$, $P_2$, $P_3$, $P_4$, and $P_B$ is used as a bias optical output (operation reference point optical quantity). Incidentally, supply currents to the semiconductor laser to obtain the fundamental optical outputs are $I_B$, $I_1$, $I_3$, $I_4$, respectively.

The optical output $P_4$ is set to an optical output which provides at least the maximum density at the maximum exposure time (one pixel clock) and the bias optical output $P_B$ is set to an optical quantity at which the photosensitive material does not react even at the maximum exposure time (one pixel clock) by always keeping ON state of the laser with the bias current $I_B$. The optical outputs $P_1$, $P_2$, $P_3$ are set appropriately in accordance with the characteristics of the optical outputs for the current of the semiconductor laser used and with the gamma characteristics of the photosensitive material used so that gradation changes smoothly. As a guideline, they are set so that the density values of 0.5–0.6, about 1.0 and about 1.5 can be obtained for $P_1$, $P_2$ and $P_3$, respectively, at the maximum exposure time. However, these values are merely illustrative but in no way limitative.

Figure 46A:
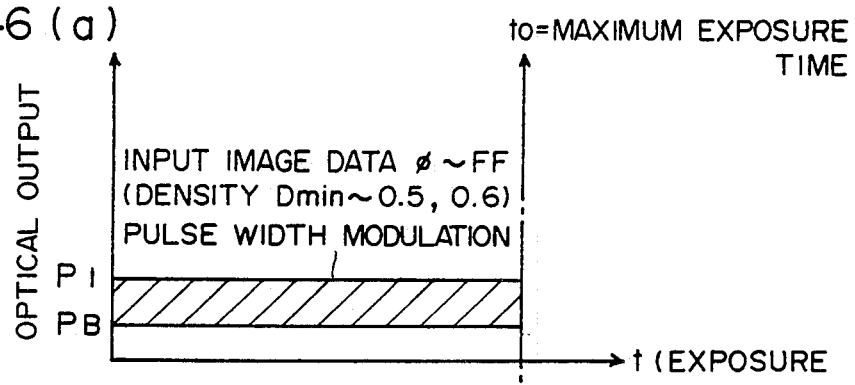
FIG. 46(a)–46(d) are diagrams useful for explaining more definitely the control characteristics of the example shown in FIG. 45.

When it is desired to obtain a density of about the minimum density $D_{min}$—0.5 or 0.6 (input image data $\phi$—FF), for the bias optical output $P_B$ the laser is kept always ON, the optical output $P_1 - P_B$, ($I_1 - I_B$ in terms of the current) is controlled by pulse modulation so that the pulse width in this pulse modulation is progressively increased in accordance with the input data, as shown in FIG. 46(a). Specifically, only the optical output $P_B$ is generated when the input data is minimum $\phi$ and whenever the data increases from this $\phi$, the pulse width is increased by the optical output $P_1 - P_B$ so that when the input data is maximum (input data FF), the laser is continuously ON for the maximum exposure time (one pixel clock) at the optical output $P_1$ (current $I_1$).

In other words, when it is desired to obtain a density of about the minimum density $D_{min}$—0.5 or 0.6, a current $I_B$ corresponding to the optical output $P_B$ is kept always flown through the semiconductor laser, a current corresponding to $I_1 - I_B$, which is to be controlled, is pulse-controlled to add a current value to be pulse-modulated to the current $I_B$ and a desired optical output can be obtained as a total. In this manner the gradation corresponding to the pulse resolution can be obtained between the optical outputs $P_B$ and $P_1$.

Figure 46B:
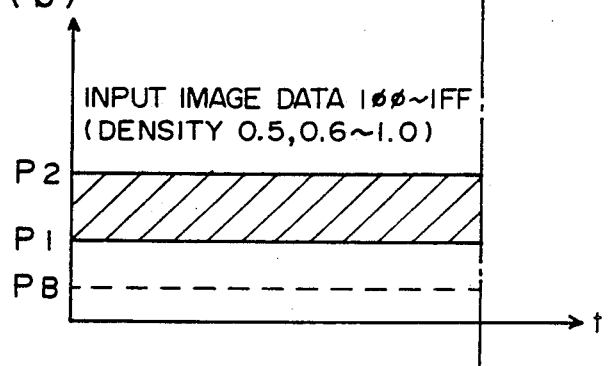

Similarly, when it is desired to obtain a density of about 0.5, 0.6–1.0 (input data $1\phi\phi$—1FF), the optical output $P_1$ is kept always as shown in FIG. 46(b), a current corresponding to the optical output $P_2 - P_1$ ($I_2 - I_1$ in terms of current) is controlled by pulse modulation and the pulse width in the pulse modulation is increased progressively in accordance with the input data. In other words, when the input data is $1\phi\phi$, only the optical output $P_1$ is KEPT and whenever the data increases from $1\phi\phi$, the pulse width is increased corresponding to the optical output $P_2 - P_1$ so that when the input data is maximum (1FF), the laser is continuously ON for the maximum exposure time (one pixel clock) at the optical output $P_2$ (current $I_2$).

In other words, when it is desired to obtain a density of 0.5, 0.6–1.0, the current $I_B$ corresponding to the optical output $P_B$ and the current $I_1$ $\{I_B+(I_1-I_B)\}$ are caused to flow always through the semiconductor laser, the current corresponding to $I_2-I_1$, which is to be controlled, is pulse-controlled to add the pulse-modulated current to the current $I_1$ described above and a desired optical output can be obtained as a total. In this manner the gradation corresponding to the pulse resolution can be obtained between the optical outputs $P_1$ and $P_2$.

Figure 46C:
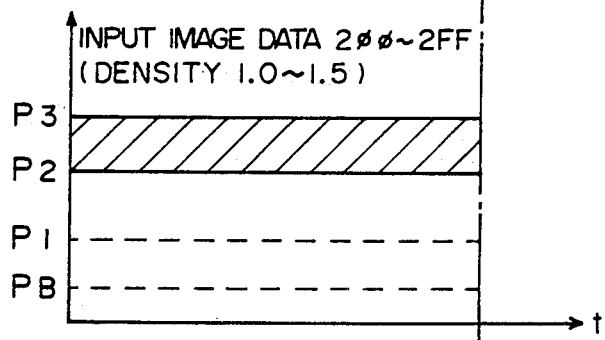

When it is desired to obtain a density of about 1.0–1.5 (input data $2\phi\phi$–2FF), the optical output $P_2$ is kept always as shown in FIG. 46(c), a current corresponding to the optical output $P_3-P_2$ ($I_3-I_2$ in terms of current) is controlled by pulse modulation and the pulse width in the pulse modulation is progressively increased in accordance with the input data. In other words, when the input data is $2\phi\phi$, only the optical output $P_2$ is kept and whenever the data increases from $2\phi\phi$, the pulse width is increased corresponding to the optical output $P_3 - P_2$ so that when the input data is maximum (2FF), the laser is continuously ON for the maximum exposure time (one pixel clock) at the optical output $P_3$ (current $I_3$).

Figure 46D:
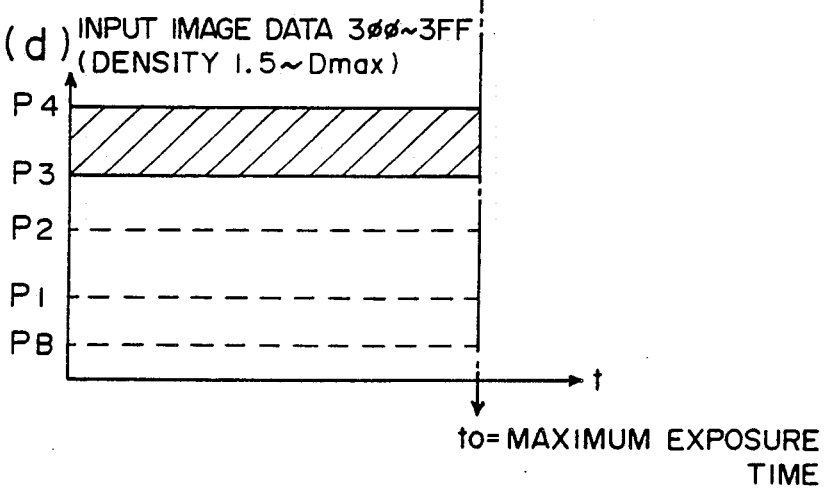

Furthermore, when it is desired to obtain 1.5 – maximum density $D_{max}$ (input data $3\phi\phi$—3FF), the optical output $P_3$ is kept always as shown in FIG. 46(d), a current corresponding to the optical output $P_4-P_3$ ($I_4-I_3$ in terms of current) is controlled by pulse modulation and the pulse width in the pulse modulation is progressively increased in accordance with the input data. In other words, when the input data is $3\phi\phi$, only the optical output $P_3$ is kept and whenever the data increases from $3\phi\phi$, the pulse width is increased corresponding to the optical output $P_4-P_3$ so that when the data is maximum (input data 3FF), the laser is continuously ON for the maximum exposure time (one pixel clock) at the optical output $P_4$ (current $I_4$).

In the case of FIGS. 46(a)–46(d), therefore, each fundamental optical output $P_B$, $P_1$, $P_2$, $P_3$ provides 256 gradations assuming that the steps of pulse modulation are 256, for example, and $256 \times 4 = 1,024$ gradations in total can be obtained.

Next, a concrete embodiment of the semiconductor laser driving apparatus described above will be hereinafter explained.

Figure 43:
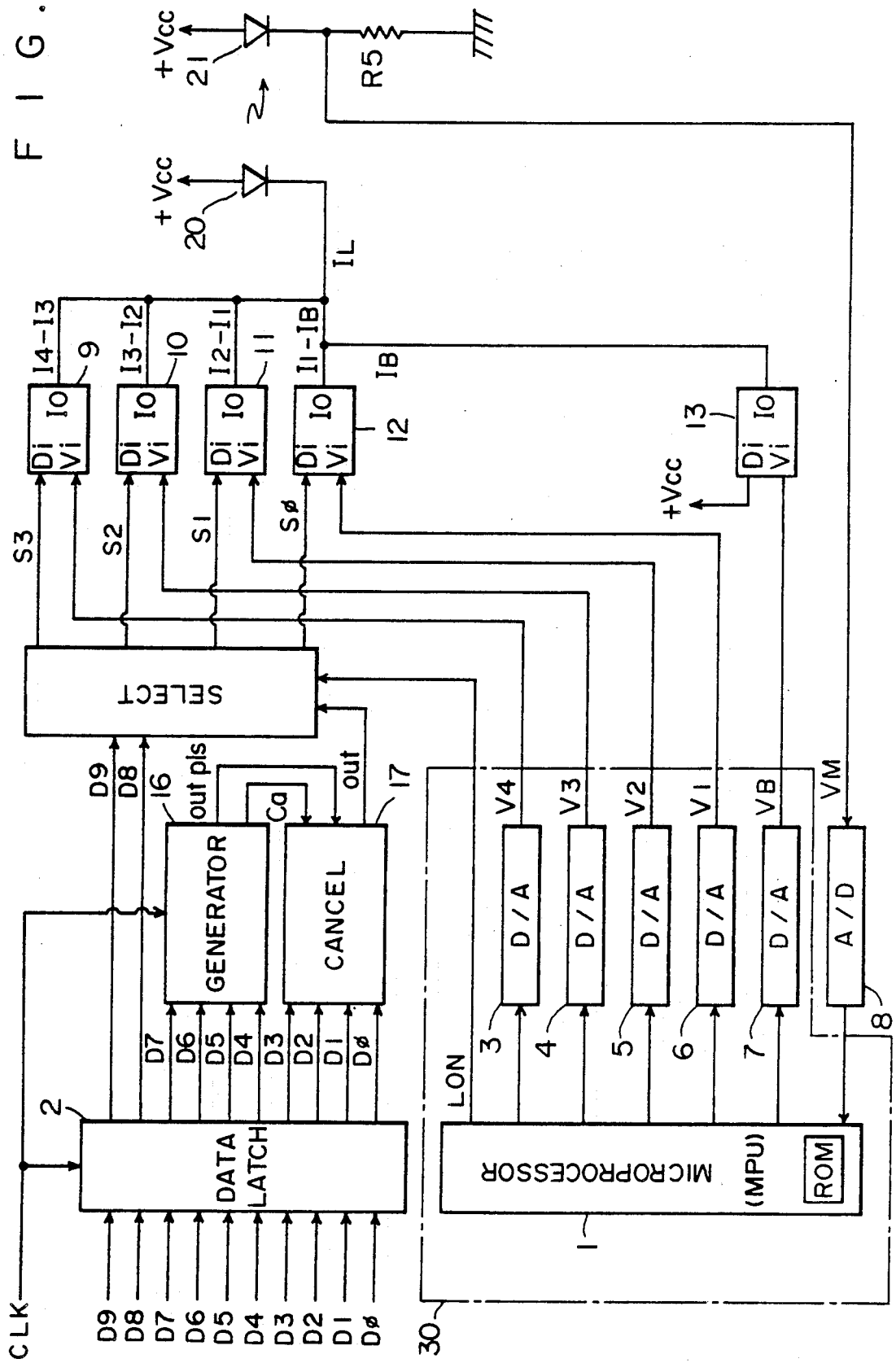
FIG. 43 is a circuit diagram showing a further embodiment of a semiconductor laser driving apparatus in accordance with the present invention.

FIG. 43 shows a circuit construction of the semiconductor laser driving apparatus in accordance with the present invention. A data latch circuit 2 latches temporarily digital input image data $D\phi$-D9 ($D\phi-\phi8$ in the first embodiment). A microprocessor (MPU) 1 has a plurality of input and output ports and executes the control of the laser beam output in accordance with the present invention by following the control procedures shown in the flowchart of FIG. 44. The control procedures (control routines) shown in the flowchart of FIG. 44 are in advance stored in an internal ROM (Read-Only Memory) of the microprocessor.

D/A (digital/analog) converters 3-7 are connected to the output ports of the microprocessor 1 and convert the digital data representing the voltage values outputted from the microprocessor 1 to analog voltages $V_B$, $V_1$-$V_4$.

The constituent elements 1, 3-7 described above constitute a voltage application circuit 30 for applying mutually different voltages to later-appear five voltage/current conversion circuits 9-13.

An A/D (analog/digital) converter 8, five voltage/current conversion circuits 9-13 as a plurality of current generation means, a generator unit 16 as first pulse width fine division control means, and a cancel unit 17 are similar to the A/D converter 8, voltage/current conversion circuits 11, 12, generator unit 16 and cancel unit 17 in the first embodiment and accordingly the explanations thereof are omitted.

A select unit 15 selects which of the voltage-current conversion circuits 9-12 is used (with the voltage/current conversion circuit 13 being always kept ON) in accordance with input data D8, D9, and a control pulse signal is sent to the input control terminal Di of each voltage/current conversion circuit 9-12 in accordance with this selection.

As described above, the semiconductor laser (laser diode) 20 is connected to the output current terminals Io of the five voltage/current conversion circuits 9-13 in the wired-OR arrangement.

The circuit construction of the five voltage/current conversion circuits 9-13 shown in FIG. 43 is the same with that shown in FIG. 3.

Next, the circuit operation of FIG. 43 will be described. The D/A converters 3~6 convert the digital data which are sent from the microprocessor 1 and represent the voltage values to the analog voltages $V_1$~$V_4$, respectively, and these voltages $V_1$~$V_4$ are inputted to the input voltage terminals Vi of the corresponding voltage/current conversion circuits 9~12. The D/A converter 7 converts the digital data sent from the microprocessor 1 to the analog voltage (bias voltage) $V_B$, and this voltage $V_B$ is inputted to the input voltage terminal Vi of the voltage/current conversion circuit 13. In this manner, the voltages inputted to the voltage/current conversion circuits 9~13 are controlled individually and the output currents of these voltage/current conversion circuits 9~13 are set so as to become $I_4-I_3$, $I_3-I_2$, $I_2-I_1$, $I_1-I_B$ and $I_B$, respectively (see FIG. 45).

Since the output terminals Io of the voltage/current conversion circuits 9~13 are connected in the wired-OR arrangement as shown in FIG. 43. a current $I_L$ supplied to the semiconductor laser 20 is the sum of each current as given below:

$$I_L = (I_4 - I_3) \times S_3 + (I_3 - I_2) \times S_2 + (I_2 - I_1) \times S_1 + (I_1 - I_B) \times S_o + I_B$$

where each of $S_0$, $S_1$, $S_2$ and $S_3$ is 0 or 1.

In other words, the addition value (or sum) of the output currents of the voltage/current conversion circuits 9~13 is supplied to the semiconductor laser 20 and when these voltage/current conversion circuits 9~13 are operated simultaneously and continuously ($S_0=S_1=S_2=S_3=1$), a current $I_4$ corresponding to the maximum optical output $P_4$ can be obtained (see FIG. 45).

Since the input control terminals $D_i$ (hereinafter referred to as the "switching terminals") of the voltage/current conversion circuits 9~13 can make ON/OFF control of the output currents, the current $I_L$ can be given as follows from the afore-mentioned formulas of the current $I_{oi}$ and $I_L$:

$$I_L = (S_0V_1 + S_1V_2 + S_2Y_3 + S_3V_4)/R10 + V_B/R10$$

Here, $S_0$~$S_3$ represent the ON/OFF state of the switching terminals Di of the voltage/current conversion circuits 9~12. When the switching terminal Di is at the high level, $S_0$~$S_3=1$ and when the switching terminal $D_i$ is at the low level, $S_0$~$S_3=0$, and the current $I_L$ is controlled in accordance with the input pulse signal to the switching terminal Di.

It will be assumed that the current optical output characteristics of the semiconductor laser 20 in this embodiment are such as those shown in FIG. 45 and the output voltages corresponding to the optical outputs $P_B$, $P_1$~$R_4$ of the photo-diode 21 for monitoring the optical quantity are $V_{BM}$, $V_{1M}$, $V_{2M}$, $V_{3M}$ and $V_{4M}$, respectively. Therefore, when the output optical quantity of the semiconductor laser 20 is $P_1$, for example, the voltage $V_1M$ is outputted from the photo-diode 21.

The data $D\phi$~$D9$ inputted to the data latch circuit 2 are the image data, $D\phi$ is the least significant bit (LSB) and D9 is the most significant bit (MSB). Laser optical quantity adjustment of $2^{10}=1,024$ gradations is made by these 10-bit data. The input data $D\phi$~$D9$ are once latched by the data latch circuit 2.

The input image data $D\phi$~$D9$ are inputted in synchronism with the rise edge of the pixel clock signal CLK (sync signal). The reason why the input image data are latched by the data latch circuit 2 is to eliminate any deviation of the rise of the input image data $D\phi$~$D9$ between them. A LON signal outputted from the microprocessor 1 is inputted to the select unit 15.

Next, the control operation of the microprocessor 1 and the action of this embodiment will be explained with reference to the flowchart of FIG. 44.

First of all, the microprocessor 1 sets the outputs of the D/A converters 3~6 and 7 to 0 V before the exposure to the photosensitive material by the laser (print operation) is made or in other words, before the image data are outputted, sets the LON signal to the high level and sets all the switching terminals Di of the voltage/current conversion circuits 9~12 to the low level (step 1). At this time, the input voltages $V_4$~$V_1$, $V_B$ of the voltage/current conversion circuits 9~13 are $V_4=V_3=V_2=V_1=V_B=0$ and consequently, the current $I_L$ flowing through the semiconductor laser 20 is $I_L=0$.

Subsequently, only the output voltage $V_B$ of the D/A convertor 7 is raised by a predetermined value (step S2). Simultaneously, the microprocessor 1 monitors the voltage $V_M$ from the photo-diode 21 through the A/D convertor 8 (step S3). Here, if the semiconductor laser 20 emits the beam, a current flows through the photo-diode 21 and a positive voltage $V_M$ occurs at the junction between the photo-diode 21 and the resistor R5. Therefore, the microprocessor 1 can determine the laser beam quantity (optical output) of the semiconductor laser 20 by measuring this voltage $V_M$.

While monitoring this voltage $V_M$, the microprocessor 1 gradually raises the output $V_B$ of the D/A convertor 7. Since the Di terminal of the voltage/current conversion circuit 13 is always kept at the high level, a current $I_L=V_B/R10$ flows through the semiconductor laser 20. When the semiconductor laser 20 emits the beam in accordance with the optical output characteristics shown in FIG. 45 and the voltage $V_M$ from the photo-diode 21 detected this optical output reaches a set value $V_{BM}$, the microprocessor 1 stops the rise of the output $V_B$ of the D/A convertor 7. Therefore, $I_L = I_B$ at this time and since the set value $V_{BM}$ is output voltage of the photo-diode 21 corresponding to the optical output $P_B$ in FIG. 45, the semiconductor laser 20 generates the optical output $P_B$.

Next, the microprocessor 1 sets the LON signal to the low level under the state where the voltage $V_B$ is kept at a value corresponding to the optical output $P_B$ and is supplied to the semiconductor laser 20 (step S4). At this time; the Di terminals of the voltage/current conversion circuits 9~12 are all at the high level and the current can flow through the output terminals Io of the voltage/current conversion circuits 9~12. The current $I_L$ flowing through the semiconductor laser 20 is given by the following formula:

$$I_L = (V_4 + V_3 + V_2 + V_1)/R10 + I_B$$

(where $I_B = V_B/R10$)

Next, the microprocessor 1 monitors the voltage $V_M$ outputted from the photo-diode 21 through the A/D convertor 8 and gradually raises the output voltage $V_1$ of the D/A convertor 6 until this voltage $V_M$ reaches the predetermined value $V_{1M}$ (the value corresponding to the optical output $P_1$: steps S5 and S6). Since the data are not outputted to the D/A convertors 3~5 at this time, the output voltages $V_4 \sim V_2$ of these D/A convertors 3~5 remain zero so that the output currents of the voltage/current conversion circuits 9~11 remain zero. Accordingly, when the voltage $V_M$ reaches the predetermined value $V_{1M}$, the predetermined value $V_{1M}$ is obtained by the sum of the voltage $V_B$ corresponding to the optical output $P_B$ outputted from the D/A convertor 7 and the voltage $V_1$ outputted from the D/A convertor 6. In other words, the optical output $P_B$ (current $I_B$) is controlled by the D/A convertor 7 and the output $P_1 - P_B$ (current $I_1 - I_B$) is controlled by the D/A convertor 6.

Similarly, while the voltages $V_B$, $V_1$ outputted from the D/A convertors 7, 6 are kept constant, the microprocessor 1 raises gradually the output voltage $V_2$ of the D/A convertor 5 and when the voltage $V_M$ reaches a predetermined value $V_{2M}$ corresponding to the optical output $P_2$ (current $I_L = I_2$), it stops the rise of the output voltage $V_2$ to determine the output voltage $V_2$ of the D/A convertor 5 (steps S7, S8).

Furthermore, while the output voltage $V_B$, $V_1$, $V_2$ of the D/A convertors 7, 6, 5 are kept at the predetermined values determined in the manner described above, the output voltage $V_3$ of the D/A convertor 4 is gradually raised and the rise if stopped when the output voltage $V_M$ of the photo-diode 21 reaches the predetermined value $V_{3M}$, and the current $I_L$ corresponding to the optical output $P_3$ (current $I_L = I_3$) can be obtained by the outputs of the D/A convertors 7, 6, 5, 4 (steps S9, S10).

Finally, while the output voltages $V_B$, $V_1$, $V_2$, $V_3$ of the D/A convertors 7, 6, 5, 4 are kept at the predetermined values determined in the manner described above, the output voltage $V_4$ of the D/A convertor 3 is raised gradually and the rise is stopped when the output voltage $V_M$ of the photo-diode 21 reaches the predetermined value $V_{4M}$ so as to obtain the current $I_L$ corresponding to the optical output $P_4$ (current $I_L = I_4$) by the outputs of the D/A convertors 7, 6, 5, 4, 3 (steps S11, S12).

As described above, since the output voltages of the D/A convertors 3~7 are set to the values providing the predetermined optical outputs $P_1 \sim P_4$, $P_B$ (see FIG. 45) of the semiconductor laser 20, the optical output which is always stable can be obtained by preventing the changes of the optical output due to the temperature change of the semiconductor laser 20 and to the variance of its characteristics. Incidentally, the reference current setting means in this embodiment corresponds to the steps S1~S12 and the hardwares of this reference current setting means consist of the microprocessor 1, the A/D convertor 8 and the D/A convertors 3~7.

Next, the microprocessor 1 sets the LON signal to the high level (step S13) and starts the image data read operation and the print operation (step S14). At this time the input image data $D\phi \sim D9$ pass through the data latch circuit 2 as the current control means, the generator unit 16, the cancel unit 17 and the select unit 15 and are converted to the exposure energy of 1,024 ($2^{10}$) steps. This embodiment employs the structure of obtaining 256 ($2^8$) steps by pulse width modulation and the remaining two bits are kept by the current value (optical output). Thus, the steps become $256 \times 2^2 = 1,024$ steps.

Among the input data $D\phi \sim D9$, the lower order 8 bits $D\phi D7$ are used for pulse width discrimination and the upper order two bits are used for current source switching. The upper order 2 bits select the voltage/current conversion circuits 9~12 and the optical output obtained by the 256 steps of pulse width modulation is added to the optical output (base optical output) obtained by the selected voltage/current conversion circuit 9~12 to control the optical output of the semiconductor laser 20. Accordingly, when the base optical outputs are $P_B$, $P_1$, $P_2$, $P_3$, the optical output control of 256 steps is made at each of these base optical outputs and $256 \times 4 = 1,024$ exposure energy (gradations) is controlled. Incidentally, such exposure energy control will be later described in further detail.

The pulse width out pls divided by 16 in the generator unit 16 is further divided by 16 by the cancel unit 17 and the pulse width modulation of the 256 steps is effected. Next, the allotment control of the voltage/current conversion circuits 9~12 by the select unit 15 will be explained. The select unit 15 controls ON/OFF of the four voltage/current conversion circuits 9~12 and the application of the pulse width modulation signal on the basis of the image input data D8, D9, so that the current generation by the voltage/current conversion circuits 9~12 is controlled.

As shown in FIG. 47, the select unit 15 consists of a multiplexer (MPX) 71 for switching the output destination of the pulse width modulation signal out from the cancel unit 17 in accordance with the input data D8, D9, and a logic for setting the ON/OFF state of the one other than the voltage/current conversion circuits 9~12 making the pulse width modulation and a compulsive turn-ON logic at the time of setting of the optical output of the semiconductor laser 20 (at the time of setting of the current value to obtain a desired optical output) consisting of a plurality of logical product AND circuits and logical sum OR circuits.

As shown in FIG. 48, when both D8 and D9 are 0, all of $S_3$, $S_2$ and $S_1$ inputted to the switching terminals Di of the voltage/current conversion circuits 9~11 are made zero so as not to output the current by the voltage/current conversion circuits 9~11. The pulse signal out (S$\phi$) from the cancel unit 17 which is subjected to pulse width modulation on the basis of the image input data D$\phi$~D7 is outputted to the switching terminal Di of the voltage/current conversion circuit 12. Accordingly, the bias current $I_B$ from the voltage/current conversion circuit 13 and the current of the 256 steps obtained by pulse-modulating the current $I_1-I_B$ from the current conversion circuit 12 flow through the semiconductor laser 20 (see FIG. 45) and the 256 gradations can be obtained between the optical output $P_B$ and $P_1$ (see FIG. 46(a)).

Similarly, when D8 is 1 and D9 is zero, "S$\phi$, S1, S2, S3" is set to "1, out, $\phi$, $\phi$". In this manner, while $I_1-I_B$ from the voltage/current conversion circuit 12 is continuously outputted with the bias current $I_B$ from the voltage/current conversion circuit 13, the pulse signal out from the cancel unit 17 which is pulse-width modulated on the basis of the image input data D$\phi$~D7 is outputted to the voltage/current conversion circuit 11. Accordingly, the bias current $I_B$ from the voltage/current conversion circuit 13, the current $I_1-I_B$ from the voltage/current conversion circuit 12 and the current of the 256 steps obtained by the pulse width modulation of $I_2-I_1$ from the voltage/current conversion circuit 11 flow through the semiconductor laser 20 and the 256 gradations can be obtained between the optical outputs $P_1$ and $P_2$ (see FIG. 46(b)).

Furthermore, when D8 is zero and D9 is 1, "S$\phi$, S1, S2, S3" changes to "1, 1, out, $\phi$" and the currents $I_B$, $I_1-I_B$ and $I_2-I_1$ are continuously outputted from the voltage/current conversion circuits 13, 12, 11, respectively, while the pulse signal out is outputted to the voltage/current conversion circuit 10, so that the 256 gradations can be obtained between the optical outputs $P_2$ and $P_3$ (see FIG. 46(c)).

When both D8 and D9 are 1, "S$\phi$, S1, S2, S3" changes to "1, 1, 1, out" so that the currents $I_B$, $I_1-I_b$, $I_2-I_1$ and $I_3-I_2$ are continuously outputted from the voltage/current conversion circuits 13, 12, 11, 10, respectively, while the pulse signal out is outputted to the voltage/current conversion circuit 9 so that the 256 gradations can be obtained between the optical outputs $P_3$ and $P_4$ (see FIG. 46(d)).

In this manner, according to this embodiment, the current generation by the five voltage/current conversion circuits 9~13 is pulse-controlled and the pulse width can be modulated to the 256 steps. Accordingly, the optical output control of the 1,024 steps (gradation control of 1,024 steps) can be made by the five voltage/current conversion circuits 9~13. In comparison with the circuit construction for obtaining the gradations by only the combined control of the power sources, this embodiment can obtain the equivalent gradations by about the half power sources. Since the necessary gradation is obtained by switching the pulse width modulation and the power source, time resolution of the GHz order need not be used for making pulse modulation. Furthermore, since the five voltage/current conversion circuits 9~13 are used as the current sources in this embodiment, the gradation having smooth change characteristics can be obtained accurately by suitably setting the generated current at each of these power sources even at the non-linear portion in the characteristics of the optical output of the semiconductor laser 20 and the supply current. In this embodiment, the bias current $I_B$ is used. However, it may be considered that the bias current $I_B$ is eliminated and the output current is set to $I_1$ from $I_1-I_B$.

Though the embodiment described above uses the bias current $I_B$, it is possible to eliminate the bias current $I_B$ by changing the output current from the voltage/current conversion circuit 12 from $I_1-I_B$ to $I_1$.

Figures 24, 25:
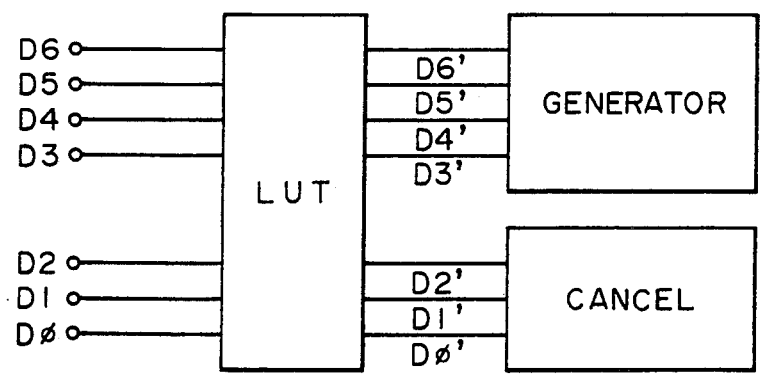
FIG. 24 is a block diagram showing another embodiment wherein a bit number of the input data shown in FIG. 1 is changed.
FIG. 25 is a table showing a conversion table shown in FIG. 24.

In the embodiments described above, the state of the power of 2 is allotted to the generator unit 16, the cancel unit 17 and the select unit 15 but this is not particularly limitative. For example, if the number of steps is 6 in the cancel unit 17 and 13 in the generator unit 16, $6<2^3=8$, $13<2^4=16$. Therefore, the 3-bit data and the 4-bit data may be given to them, respectively. In this case, a conversion table (LUT) consisting of ROM or the like is prepared to convert the input data D$\phi$~D6 to D$\phi'$~D6' as shown in FIG. 24. In other words, the input data may be converted this case so that the conversion data increase by the pitch corresponding to the hexagonal (cancel unit 17) and to the duodecimal (generator unit 16) at the upper order of the former as shown in FIG. 25.

Furthermore, it is possible to employ the arrangement wherein the bias current $I_B$ is OFF when all the input data are "$\phi$" by inputting the logical sum of D$\phi$~D9 as the Di input of the voltage/current conversion circuit 13 for the bias current $I_B$ without using $V_{cc}$.

Figure 49:
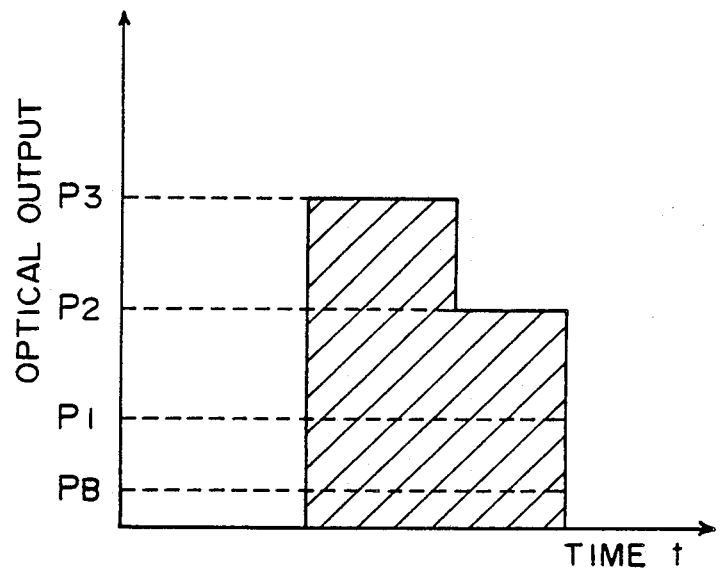
FIG. 49 is a diagram showing optical output characteristics in the embodiment described above.

In the embodiment described above, the rise of the pulse and the fall of the pulse at the maximum pulse width are in agreement with the respective voltage/current conversion circuits 9~13 as shown in FIG. 49 but in this case, the five voltage/current conversion circuits 9~13 are simultaneously ON and OFF at the rise and fall so that great ringing and noise are likely to occur from time to time.

Figure 50:
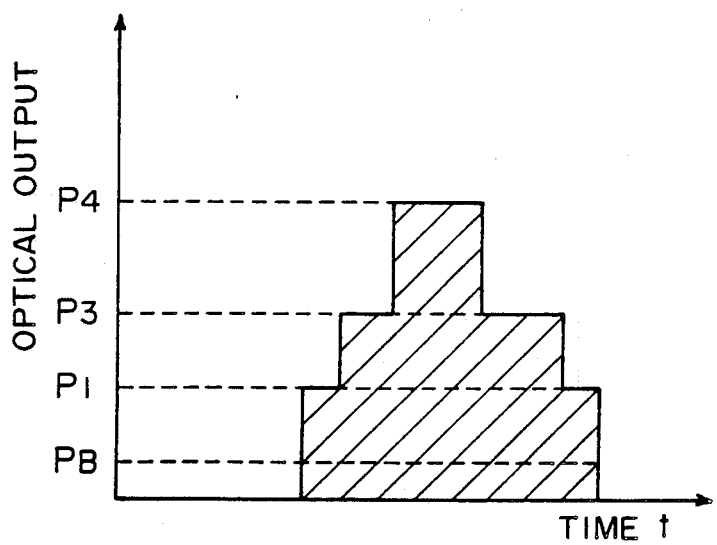
FIG. 50 is a diagram showing control characteristics when a current generation timing of each voltage/current conversion circuit in the embodiment described above is deviated.

This problem can be solved by reducing progressively the maximum pulse width for the higher order current sources (9>10>11>12>13) as shown in FIG. 50 and preventing the rise and fall from being in mutual agreement.

Incidentally, although the semiconductor laser driving apparatus is composed by use of the five voltage/current conversion circuits 9~13 in the embodiment described above, obviously the number of the current sources is not particularly limited thereto and the pulse modulation is not necessarily limited to 256 ($2^8$) steps, either.

<Effect of the Invention>

According to the present invention described above, a plurality of current sources consisting of voltage/current conversion circuits or the like are connected in parallel and a semiconductor laser is connected in series with their junction terminal so as to make pulse control of the current generation by the current sources. Accordingly, the currents to be supplied to the semiconductor laser can be controlled by the switching control of the current sources and the pulse modulation, and the necessary and sufficient optical output steps can be obtained with high accuracy by the minimum necessary current sources without the necessity for high precision time resolution and D/A convertors. Therefore, in a printer using a semiconductor laser, for example, necessary and sufficient gradations can be obtained with high accuracy and gradation design becomes easy.

If a sync signal for controlling the optical output of the semiconductor laser is generated by a frequency divider, the pulse width can be finely divided by use of a high frequency signal inputted to this frequency divider.

Furthermore, since the pulse width is finely divided by finely dividing the high frequency signal and calculating the logical sum or logical product between this delay signal and a fundamental pulse width, the pulse divided finely from the fundamental pulse can be generated even under the state where the fundamental pulse does not have the rise or fall, and resolution performance of the pulse width can be secured.

Since the generation current values in a plurality of current sources are variably set by detecting the optical output of the semiconductor laser, a desired optical output can be obtained even when the optical output characteristics of the semiconductor laser change due to variance of production or to temperature influences.

The occurrence of noise generated when a plurality of current sources are simultaneously turned ON and OFF can be avoided by deviating the rise and fall timings of the current generation of each current source when each current source is ON/OFF controlled.

What is claimed is:

1. In a semiconductor laser driving apparatus wherein an irradiating energy of a semiconductor laser is adjusted multi-stepwise by controlling an irradiating time and an optical output of the semiconductor laser, the improvement characterized in that the irradiating energy is adjusted by varying the irradiating time within a maximum irradiating time while maintaining at a constant value the optical output when the irradiating energy is lower than a predetermined value, whereas the irradiating energy is adjusted by increasing the optical output more than said constant value while fixing the irradiating time to the maximum irradiating time when the irradiating energy is higher than said predetermined value.

2. The semiconductor laser driving apparatus according to claim 1, wherein the optical output is increased by increasing a bias optical output.

3. The semiconductor laser driving apparatus according to claim 1, wherein the optical output is increased by changing selectively current sources for a plurality of weighted semiconductor laser connected in parallel with one another.

4. The semiconductor laser driving apparatus according to claim 1, 2 or 3, wherein an optical output decay means is inserted in a light path of the semiconductor laser so that the optical output is controlled in a region where the optical output is varied linearly with respect to the change of a supply current when the irradiating energy is adjusted by controlling the optical output.

5. A semiconductor laser driving apparatus characterized by comprising a plurality of current generation means whose current generation is controlled in accordance with input pulse signals; a semiconductor laser connected in series with parallel connection terminals of these current generation means; and current control means for adjusting a supply current to the semiconductor laser by controlling pulse widths of input pulse signals to a plurality of current generation means, respectively.

6. The generation laser driving apparatus according to claim 5, wherein said plurality of current generation means are composed of voltage-to-current conversion circuits for converting an input voltage to a current and outputting the current.

7. The semiconductor laser driving apparatus according to claim 5 or 6, further comprising synchronous signal generation means for generating a sync signal for the input pulse signal by use of a frequency divider, and first pulse width fine division control means for setting the pulse width of the input pulse signal by the current control means on the basis of a high frequency signal inputted to the frequency divider.

8. The semiconductor laser driving apparatus according to claim 7, further comprising second pulse width fine division control means for setting the pulse width of the input pulse signal by the current control means by finely dividing a predetermined fundamental pulse width, by delaying a predetermined high frequency signal and calculating the logical sum or logical product between the delay signal and the predetermined fundamental pulse width.

9. The semiconductor laser driving apparatus according to claim 8, further comprising optical detection means for detecting the optical output of the semiconductor laser and reference current setting means for setting variably the generation current values of the plurality of the current generation means on the basis of the optical output detected by the optical output detection means.

10. The semiconductor laser driving apparatus according to claim 9, further comprising current generation timing control means which deviates the rise and fall timings of the current generation in each of the plurality of current generation means.

11. The semiconductor laser driving apparatus according to claim 5, further comprising second pulse width fine division control means for setting the pulse width of the input pulse signal by the current control means by finely dividing a predetermined fundamental pulse width, by delaying a predetermined high frequency signal and calculating the logical sum or logical product between the delay signal and the predetermined fundamental pulse width.

12. The semiconductor laser driving apparatus according to claim 5, further comprising optical output detection means for detecting the optical output of the semiconductor laser and reference current setting means for setting variably the generation current values of the plurality of the current generation means on the basis of the optical output detected by the optical output detection means.

13. The semiconductor laser driving apparatus according to claim 5, further comprising current generation timing control means which deviates the rise and fall timings of the current generation in each of the plurality of current generation means.

* * * * *

UNITED STATES PATENT AND TRADEMARK OFFICE
CERTIFICATE OF CORRECTION

PATENT NO. : 4,998,257
DATED : March 05, 1991
INVENTOR(S) : Bill On et al.

It is certified that error appears in the above-identified patent and that said Letters Patent is hereby corrected as shown below:

Title page, Foreign Priority Data, please insert
--February 7, 1990   Japan ................2-28020--.

Signed and Sealed this

Nineteenth Day of January, 1993

Attest:

DOUGLAS B. COMER

*Attesting Officer*   Acting Commissioner of Patents and Trademarks